United States Patent
Goto et al.

(10) Patent No.: US 10,971,387 B2
(45) Date of Patent: Apr. 6, 2021

(54) MASK-INTEGRATED SURFACE PROTECTIVE TAPE

(71) Applicant: FURUKAWA ELECTRIC CO., LTD., Tokyo (JP)

(72) Inventors: Yusuke Goto, Tokyo (JP); Hirotoki Yokoi, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 16/286,322

(22) Filed: Feb. 26, 2019

(65) Prior Publication Data

US 2019/0198378 A1  Jun. 27, 2019

Related U.S. Application Data

(63) Continuation of application No. PCT/JP2017/030714, filed on Aug. 28, 2017.

(30) Foreign Application Priority Data

Aug. 29, 2016  (JP) ............................. JP2016-167148

(51) Int. Cl.
  *H01L 21/683* (2006.01)
  *B23K 26/38* (2014.01)
  (Continued)

(52) U.S. Cl.
  CPC ........ *H01L 21/6836* (2013.01); *B23K 26/364* (2015.10); *B23K 26/38* (2013.01);
  (Continued)

(58) Field of Classification Search
  CPC ............... H01L 21/6836; H01L 21/304; H01L 21/67132; H01L 21/67092; C09J 201/00; B23K 26/38
  See application file for complete search history.

(56) References Cited

U.S. PATENT DOCUMENTS

| | | | |
|---|---|---|---|
| 2006/0035060 A1* | 2/2006 | Koyama | ................ C08J 7/0427 428/141 |
| 2014/0295646 A1 | 10/2014 | Shinoda et al. | |
| 2017/0323805 A1 | 11/2017 | Kotera et al. | |

FOREIGN PATENT DOCUMENTS

| | | |
|---|---|---|
| EP | 2832810 A1 | 2/2015 |
| JP | 2007-19385 A | 1/2007 |

(Continued)

OTHER PUBLICATIONS

International Search Report for PCT/JP2017/030714 (PCT/ISA/210) dated Oct. 17, 2017.
(Continued)

*Primary Examiner* — Mohammed R Alam
(74) *Attorney, Agent, or Firm* — Birch, Stewart, Kolasch & Birch, LLP

(57) ABSTRACT

A mask-integrated surface protective tape for production of semiconductor chips, with the production containing steps (a) to (d), which tape comprises a base film and a mask material layer provided thereon, wherein a wetting tension of the base film on the side from which the mask material layer has been peeled is from 20.0 mN/m to 48.0 mN/m, and wherein a surface roughness Ra of the base film on the side from which the mask material layer has been peeled is within a range from 0.05 μm to 2.0 μm when measured in conformity to JIS B0601,
(a) a specific laminating step;
(b) a specific peeling step;
(c) a specific plasma-dicing step; and
(d) a specific ashing step.

2 Claims, 6 Drawing Sheets

(51) Int. Cl.
*H01L 21/304* (2006.01)
*C09J 201/00* (2006.01)
*B23K 26/364* (2014.01)
*C09J 7/29* (2018.01)
*H01L 21/3065* (2006.01)
*H01L 21/78* (2006.01)

(52) U.S. Cl.
CPC .............. *C09J 7/29* (2018.01); *C09J 201/00* (2013.01); *H01L 21/304* (2013.01); *H01L 21/3065* (2013.01); *H01L 21/78* (2013.01); *C09J 2203/326* (2013.01); *C09J 2301/414* (2020.08); *C09J 2423/046* (2013.01); *C09J 2431/006* (2013.01); *C09J 2433/006* (2013.01); *H01L 2221/68327* (2013.01)

(56) References Cited

FOREIGN PATENT DOCUMENTS

| JP | 2009-33155 A | 2/2009 |
| JP | 2012-169670 A | 9/2012 |
| JP | 2014-30029 A | 2/2014 |
| WO | WO 2014/080918 A1 | 5/2014 |
| WO | WO 2016/125796 A1 | 8/2016 |

OTHER PUBLICATIONS

Written Opinion of the International Searching Authority for PCT/JP2017/030714 (PCT/ISA/237) dated Oct. 17, 2017.
Extended European Search Report, dated Jul. 21, 2020, for European Application No. 17846396.4.

\* cited by examiner

MASK-INTEGRATED SURFACE PROTECTIVE TAPE

CROSS-REFERENCE TO RELATED APPLICATIONS

This application is a Continuation of PCT International Application No. PCT/JP2017/030714 filed on Aug. 28, 2017, which claims priority under 35 U.S.C. § 119 (a) to Japanese Patent Application No. 2016-167148 filed in Japan on Aug. 29, 2016. Each of the above applications is hereby expressly incorporated by reference, in its entirety, into the present application.

TECHNICAL FIELD

The present invention relates to a mask-integrated surface protective tape.

BACKGROUND ART

In recent years, the remarkable evolution is impressive on the thinning of the semiconductor chip and the downsizing of the chip. In particular, the thinning is required in the IC cards with built-in semiconductor IC chips, such as a memory card and a smart card. Further, the downsizing of the chip is required in LED or LCD driving devices and the like. With the increase in these demands from now, the needs for the thinning of the semiconductor chip and the downsizing of the chip are thought of as being increased much more.

These semiconductor chips are obtained by: thinning a semiconductor wafer to a predetermined thickness in the backgrinding step, an etching step, or the like; and then dividing the semiconductor wafer into individual chips through a dicing step. In this dicing step, a blade dicing method of cutting the semiconductor wafer with a dicing blade has been used. In this blade dicing method, the cutting resistance by the blade is put directly on the semiconductor wafer at the time of cutting. For this reason, a microscopic crack (or chipping) sometimes occurs in the semiconductor chip by this cutting resistance. Occurrence of the chipping does not only deteriorate outer appearance of the semiconductor chip, but also in some cases, there is a risk that a damage of chips is occurred due to lack (or insufficiency) of the transverse rupture strength (or deflective strength) at the time of picking up, and that even a circuit pattern on the chip may be damaged. Further, in the foregoing physical dicing step using such a blade, it is impossible to set the width of a kerf (also referred to as a scribe line or a street) which is an interval between chips to less than the thick blade width. As a result, the number (the yield) of chips which can be obtained from a sheet of wafer decreases. Further, a long time period to be taken for the processing of the wafer was also a problem.

In the dicing step, use is also made of any of various kinds of methods other than the blade dicing method.

For example, there is a DBG (pre-dicing) method of, in view of the difficulty in carrying out the dicing after the thinning of the wafer, forming in first a groove with a predetermined thickness in the wafer, and then carrying out a grinding processing, thereby achieving both the thinning and the singulation into chips at the same time. According to this method, although the kerf width is similar to that in the blade dicing method, this method has the advantage that the transverse rupture strength of the chip is increased, so that a damage of the chip can be suppressed.

Further, there is a laser dicing method of carrying out a dicing step by a laser.

The laser dicing method has an advantage of being able to narrow a kerf width and also being able to conduct the dicing in dry process. However, there is a disadvantage that a wafer surface is contaminated with a sublimate at the time of cutting by a laser, and therefore sometimes it is necessary to conduct a pre-treatment of protecting the wafer surface with a predetermined liquid protecting material. Further, the foregoing dry process has not yet led to achievement of a complete dry process. Meanwhile, the laser dicing method allows a further speeding-up of the processing speed, as compared to the blade dicing method. However, the laser dicing method remains unchanged in carrying out a processing along every one line, and therefore it takes a certain time period for producing an extremely small chip.

Further, there is a method of using a wet process such as a water-jet method of carrying out a dicing step with a water pressure.

In this method, there is a possibility that a problem arises with a material which is necessary to be prevented sophisticatedly from a surface contamination, such as a MEMS device and a CMOS sensor. Further, this method has a restriction in narrowing a kerf width, so that a yield of the chips obtained becomes low.

Further, it is known a stealth dicing method of: forming a modifying layer by a laser in the thickness direction of the wafer; and then dividing the modifying layer by expansion, to singulate the wafer.

This method has the advantage that a kerf width can be reduced to zero and a processing can be carried out in a dry state. However, the transverse rupture strength of the chip tends to be lowered by the thermal history at the time of forming the modifying layer. Further, silicon debris sometimes occurs at the time of dividing the modifying layer by expansion. Further, there is a risk that the collision of each adjacent chips may be bring about short (or insufficiency) of the transverse rupture strength.

Further, as a combined method of the stealth dicing and the pre-dicing, there is a chip-singulation method corresponding to a narrow scribe width, which includes: forming, in first, a modifying layer with only a predetermined width prior to the thinning; and, then, carrying out a grinding processing from the backing-face side, for thereby achieving the thinning and the singulation into chips at the same time.

This technique improves the disadvantages of the above mentioned process, and has the advantage that a kerf width is zero and a chip yield is high and also the transverse rupture strength is increased, because a silicon modifying layer is cleaved and singulated by a stress in the wafer backgrinding processing. However, because singulation is performed in the backgrinding processing, a phenomenon is sometimes occurred, in which an end side of the chip collides with an adjacent chip, so that the chip corner is chipped (or broken).

In addition to the above, there is a plasma dicing method (for example, see Patent Literature 1).

The plasma dicing method is a method of: dividing a semiconductor wafer, by selectively etching by plasma a portion which is not covered with a mask. When this dicing method is used, segmentation of chips can be achieved selectively, and even if the scribe line is curved, the segmentation is possible with no trouble. Further, as the etching rate of the semiconductor wafer is very high, in recent years, this dicing method is considered one of the most preferable processes for the segmentation of chips.

In the plasma dicing method, a fluorine-based gas which has a very high reactivity with wafers, such as sulfur hexafluoride ($SF_6$) and carbon tetrafluoride ($CF_4$), is used as a plasma generation gas. Because of its high etching rate, a mask protection is essential for the surface that is not etched, and therefore a mask formation in advance becomes necessary.

For this mask formation, as described in Patent Literature 1, it has been commonly used for a technology of coating a resist on a wafer surface, and then removing a portion corresponding to a street using a photolithography process, thereby for masking the wafer surface. Therefore, in the past, photolithography process equipment other than the plasma dicing equipment was necessary.

Further, because of being in a state where a mask (resist film) remains after the plasma etching, use of a large amount of a solvent was necessary for the mask removal. Nevertheless, the removal of the mask is not always completely performed, which sometimes resulted in occurrence of defective chips. Further, there was a disadvantage that an overall processing process is prolonged, in order to go through the masking process using a resist.

CITATION LIST

Patent Literature

Patent Literature 1: JP-A-2007-19385 ("JP-A" means unexamined published Japanese patent application)

SUMMARY OF INVENTION

Technical Problem

In the above-described conventional art, there was a problem of increase in the chip cost, and therefore a different means from the viewpoint of cost control and the like has been required.

Further, in recent years, the thickness of the semiconductor chip tends to become thinner and thinner. Even in a case where a semiconductor wafer backing-face side was subjected to backgrinding thinly in this way, it is necessary to adhere well to a patterned surface of the semiconductor wafer and to protect effectively the patterned surface.

Further, in the mask-integrated surface protective tape, after backgrinding of the semiconductor wafer, only a mask material (layer) is left on the patterned surface of the semiconductor wafer from the mask-integrated surface protective tape. In order to peel between a temporary-adhesive layer and the mask material layer, this peeling must be performed easily without adhesive deposits. In the conventional art, for easy peeling between the temporary-adhesive layer and the mask material layer in the peeling step, it was necessary to make appropriate adjustments, such as increase in elasticity and reduction in adhesion force of the temporary-adhesive layer or the mask material layer.

In the above-described peeling, it is required to easily expose the mask material layer on the wafer surface, and it is necessary to make dicing (singulate) a wafer into chips with a certainty and a high degree of accuracy by $SF_6$ plasma. Further, after plasma dicing (after wafer division), it is necessary to remove a mask material of the mask material layer with more certainty by $O_2$ plasma, thereby to highly suppress occurrence of defective chips.

However, in the above-described peeling step, when elasticity of the temporary-adhesive layer or the mask material layer is made high, in a case of a large asperity (or unevenness) of the circuit pattern formed on a semiconductor wafer, these layers cannot be adhered sufficiently to the circuit pattern, whereby there is a possibility that this may cause so-called seepage or the like by which a grinding water containing a silicon grinding dust gets in through the gap between the mask-integrated surface protective tape and the semiconductor wafer in backgrinding, thereby for contaminating a semiconductor wafer circuit surface. On the other hand, when peeling from the temporary-adhesive layer was made easy by lowering an adhesion force of the mask material layer, an adhesion force between the semiconductor wafer and the mask material is also lowered, so that there is a high possibility that the seepage will occur.

Accordingly, the present invention is contemplated for providing a mask-integrated surface protective tape for a plasma dicing method, which has a good protection property of the patterned surface of the semiconductor wafer in the backgrinding step which is performed in a large thinning degree and a good peeling property of the mask material layer from a base film of the surface protective tape, and which is low in adhesive deposits and occurrence of defective chips. Further, the present invention is contemplated for providing a photolithography process-unnecessary mask-integrated surface protective tape.

In addition to these, the present invention is contemplated for providing a mask-integrated surface protective tape which is able to produce inexpensively a semiconductor chip, with high productivity and shortened processing process, while highly preventing from occurrence of defective chips, in this way.

Solution to Problem

That is, the present invention is to provide the following means:

[1] A mask-integrated surface protective tape that can be used for production of semiconductor chips, with the production containing the following steps (a) to (d), which tape comprises a base film and a mask material layer provided on the base film, wherein a wetting tension of the base film on the side from which the mask material layer has been peeled is 20.0 mN/m or more and 48.0 mN/m or less, and wherein a surface roughness Ra of the base film on the side from which the mask material layer has been peeled is within a range of 0.05 μm or more and 2.0 μm or less when measured in conformity to JIS B0601, (a) a step of, in the state of having laminated the mask-integrated surface protective tape on the side of a patterned surface of a semiconductor wafer, grinding the backing-face side of the semiconductor wafer; laminating a wafer fixing tape on the backing-face side of the ground semiconductor wafer; and supporting and fixing the wafer to a ring flame;

(b) a step of, after peeling the base film of the mask-integrated surface protective tape, thereby to expose the mask material layer on top, forming an opening of a street of the semiconductor wafer by cutting a portion of the mask material layer corresponding to the street of the semiconductor wafer by laser;

(c) a plasma-dicing step of segmentalizing the semiconductor wafer on the street by a $SF_6$ plasma, thereby singulating the semiconductor wafer into semiconductor chips; and (d) an ashing step of removing the mask material layer by an $O_2$ plasma.

[2] The mask-integrated surface protective tape described in the item [1], wherein the mask material of the mask-integrated surface protective tape is of radiation-curing type.
[3] The mask-integrated surface protective tape described in the item [1] or [2], wherein a contact angle of the mask material layer with pure water is 85° or more and 150° or less.
[4] The mask-integrated surface protective tape described in any one of the items [1] to [3], wherein a storage elastic modulus of the mask material layer at 23° C. is $2.0 \times 10^4$ Pa or more and $1.2 \times 10^5$ Pa or less.[5] The mask-integrated surface protective tape described in any one of the items [1] to [4], wherein a storage elastic modulus of the mask material layer at 50° C. is $1.0 \times 10^4$ Pa or more and $1.0 \times 10^5$ Pa or less.
[6] The mask-integrated surface protective tape described in any one of the items [1] to [5], wherein a Young's modulus of the base film is $2.0 \times 10^7$ Pa or more and $7.0 \times 10^9$ Pa or less.
[7] The mask-integrated surface protective tape described in any one of the items [1] to [6], wherein a melting point of the resin opposite to the mask material layer side of the base film is 80° C. or more and 120° C. or less.
[8] The mask-integrated surface protective tape described in any one of the items [1] to [7], wherein an adhesion force between the mask material layer and the base film layer is 0.01 N/25 mm or more and 0.5 N/25 mm or less.
[9] The mask-integrated surface protective tape described in any one of the items [1] to [8], wherein a thickness of the mask material layer of the mask-integrated surface protective tape is larger than the patterned unevenness (or the patterned asperity) of the semiconductor wafer.
[10] The mask-integrated surface protective tape described in any one of the items [1] to [9], which is used under the condition that the unevenness on the patterned surface of the semiconductor wafer on which the mask-integrated surface protective tape is laminated is 10 μm or more.

Effects of Invention

According to the present invention, it became possible to provide a mask-integrated surface protective tape for a plasma dicing method, which has a good protection property of the patterned surface of the semiconductor wafer in the backgrinding step which is performed in a large thinning degree and a good peeling property of the mask material layer from a base film of the surface protective tape, and further reduces adhesive deposits and occurrence of defective chips. Further, according to the present invention, it became possible to provide a photolithography process-unnecessary mask-integrated surface protective tape.

In addition to these, according to the present invention, it became possible to provide a mask-integrated surface protective tape which is able to produce inexpensively a semiconductor chip with high productivity and reduced processing steps, while highly preventing from occurrence of defective chips in this way.

Other and further features and advantages of the invention will appear more fully from the following description, appropriately referring to the accompanying drawings.

BRIEF DESCRIPTION OF THE DRAWINGS

FIG. 2(a) shows a semiconductor wafer having a patterned surface, fragmentary FIG. 2(b) shows a step of laminating the mask-integrated surface protective tape, and fragmentary FIG. 2(c) shows a semiconductor wafer laminated with the mask-integrated surface protective tape.

FIG. 3(a) shows a thinning processing of the semiconductor wafer, fragmentary FIG. 3(b) shows a step of laminating a wafer-fixing tape, and fragmentary FIG. 3(c) shows a state in which the semiconductor wafer has been fixed to a ring flame.

FIG. 4(a) shows the step of peeling the base film from the mask-integrated surface protective tape while leaving the mask material layer, fragmentary FIG. 4(b) shows a state in which the mask material layer of the mask-integrated surface protective tape has been exposed (uncovered), and fragmentary FIG. 4(c) shows a step of cutting off the mask material layer corresponding to the street by laser.

FIG. 5(a) shows the step of carrying out the plasma dicing, fragmentary FIG. 5(b) shows a state in which the semiconductor wafer has been singulated into chips, and fragmentary FIG. 5(c) shows the step of carrying out the plasma ashing.

FIG. 6(a) shows a state in which the mask material layer has been removed, and fragmentary FIG. 6(b) shows the step of picking up the chip.

MODE FOR CARRYING OUT THE INVENTION

The mask-integrated surface protective tape of the present invention is used for a method of obtaining a semiconductor chip by dividing and singulating a semiconductor wafer by plasma dicing.

As described below, by using the mask-integrated surface protective tape of the present invention, a photolithography process prior to the plasma dicing step becomes unnecessary, whereby production costs of the semiconductor chip and the semiconductor product can be largely suppressed.

Figure 1:
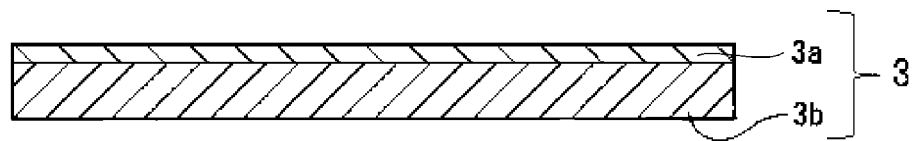
FIG. 1 is a schematic cross-sectional view showing the mask-integrated surface protective tape of the present invention.

The mask-integrated surface protective tape 3 of the present invention is all-in-one formed by laminating a mask material layer 3b on a base film 3a, thereby integrating these layers through temporary-adhesion as shown in FIG. 1. This mask material layer 3b is preferably a radiation-curing type mask material layer as described below.

The mask-integrated surface protective tape of the present invention is used in a system where the dicing method is a plasma dicing method as described above and in other words, is a mask-integrated surface protective tape for a plasma dicing method.

More specifically, when obtaining semiconductor chips from the semiconductor wafer, the mask-integrated surface protective tape of the present invention is used in the production of the semiconductor chip including the step of dividing and singulating the wafer into the semiconductor chips by plasma dicing.

Moreover, as described above, it is a photolithography process-unnecessary mask-integrated surface protective tape.

The mask-integrated surface protective tape of the present invention is used for a processing of the semiconductor wafer and in order to protect a patterned side (surface), when backgrinding the semiconductor wafer, is used by laminating it on said patterned surface.

Hereinafter, the mask-integrated surface protective tape of the present invention is explained in detail together with steps of producing the semiconductor chip (processing steps of the semiconductor wafer).

The mask-integrated surface protective tape of the present invention is more preferably used in the production of the semiconductor chip including at least the following steps (a) to (d).

In other words, the mask-integrated surface protective tape of the present invention is a mask-integrated surface protective tape for production of the semiconductor chip including the following steps (a) to (d).

[Steps (a) to (d)]
(a) a step of, in the state of having laminated the mask-integrated surface protective tape on the side of a patterned surface of a semiconductor wafer, grinding the backing-face side of the semiconductor wafer; laminating a wafer fixing tape on the backing-face side of the ground semiconductor wafer; and supporting and fixing the wafer to a ring flame;
(b) a step of, after peeling the base film of the mask-integrated surface protective tape thereby to expose the mask material layer on top, forming an opening of a street of the semiconductor wafer by cutting a portion of the mask material layer corresponding to the street of the semiconductor wafer by laser;
(c) a plasma-dicing step of segmentalizing the semiconductor wafer on the street by a $SF_6$ plasma thereby singulating the semiconductor wafer into semiconductor chips; and
(d) an ashing step of removing the mask material layer by an $O_2$ plasma.

In the method of producing a semiconductor chip in which the mask-integrated surface protective tape of the present invention is used, the following step (e), after the step (d), is preferably included. When the production method includes the following step (e), it is preferable that the following step (f) is further included after the step (e).
(e) a step of picking up the semiconductor chip from the wafer-fixing tape
(f) a step of transiting the picked-up semiconductor chip to a die bonding step In a case of using the mask-integrated surface protective tape of the present invention, the above-described step (b) includes a step of peeling the above-described base film from the above-described mask-integrated surface protective tape without irradiating a radiation thereto, thereby exposing a mask material layer on top thereof.

Hereinafter, explanation is done in detail including the steps (a) to (d) each of which is preferably used in the production of the semiconductor chip as an intended use for which the mask-integrated surface protective tape of the present invention is used.

Preferable embodiments of the method of producing a semiconductor chip using the mask-integrated surface protective tape of the present invention (hereinafter, referred to simply as "production method to which the present invention is applied") are described below with reference to the drawings. However, the present invention is not limited to the following embodiments, except for the requirements defined by the present invention. Further, the form shown in each drawing is a schematic view for facilitating the understanding of the present invention. Therefore, regarding the size, the thickness, or the relative magnitude relation and the like of each component, the large one or the small one is sometimes changed for the purpose of illustration, and the form does not show a real relation as it is. Further, the present invention is not limited to outer forms and shapes shown in these figures, except for the requirements defined by the present invention.

Meanwhile, as the apparatus, the materials and the like used in the following embodiments, an ordinary apparatus, materials and the like which have been conventionally used in the processing of the semiconductor wafer may be used, unless otherwise indicated, and the conditions of use for them can be appropriately set and optimized according to a purpose of use within a range of an ordinary method for using. Further, overlapping descriptions of the materials, structures, methods, effects, and the like, which are common to each embodiment, are omitted.

The production method to which the mask-integrated surface protective tape of the present invention is applied is described with reference to FIG. 2(a) to FIG. 6(b).

Figure 2A:
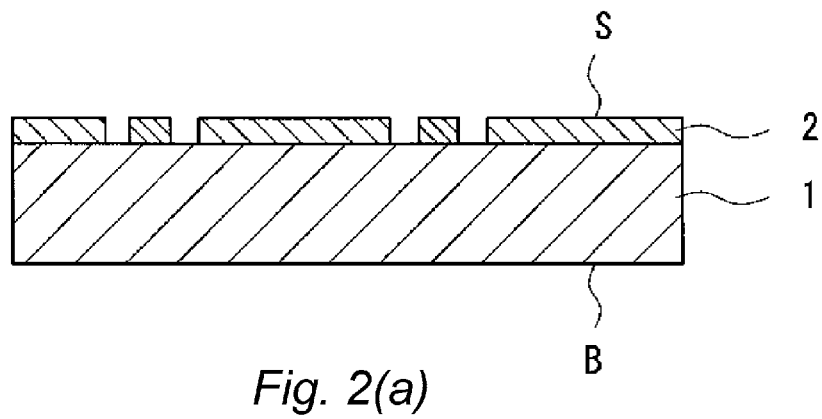
FIGS. 2(a) to 2(c) are schematic cross-sectional views illustrating steps up to lamination of a surface protective tape onto a semiconductor wafer using the mask-integrated surface protective tape of the present invention. In the views, fragmentary
Figure 2B:
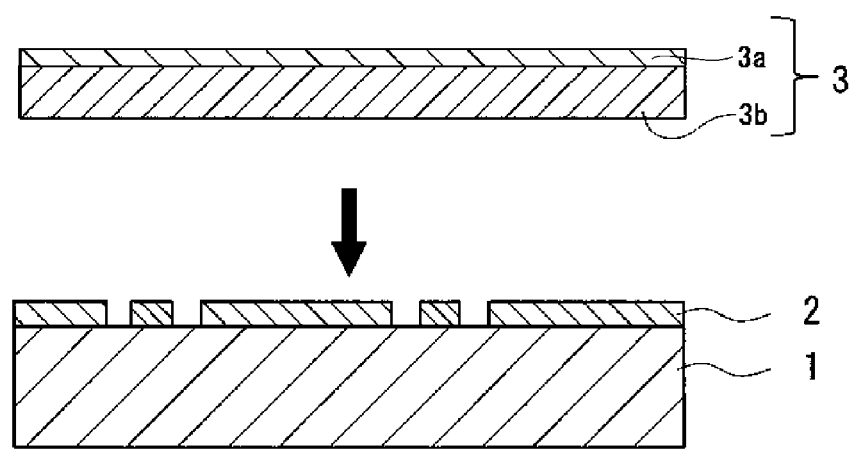
Figure 2C:
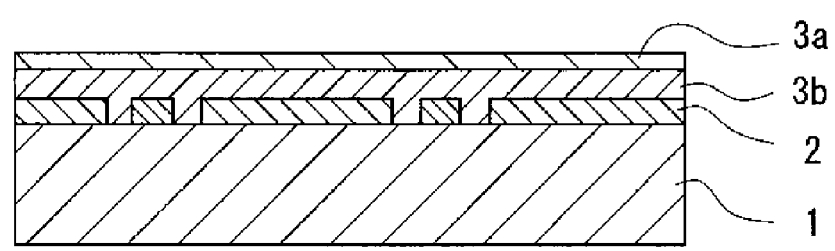

A semiconductor wafer 1 has a patterned face 2 on the surface S of which a circuit or the like of the semiconductor device is formed (see FIG. 2(a)). On this patterned surface 2, a mask-integrated surface protective tape 3 of the present invention in which a mask material layer 3b has been provided on a base film 3a is laminated in the arrow direction shown in FIG. 2(b) (see FIG. 2(b)), whereby a semiconductor wafer 1 whose patterned surface 2 is covered with the mask-integrated surface protective tape 3 of the present invention is obtained (see FIG. 2(c)).

Figure 3A:
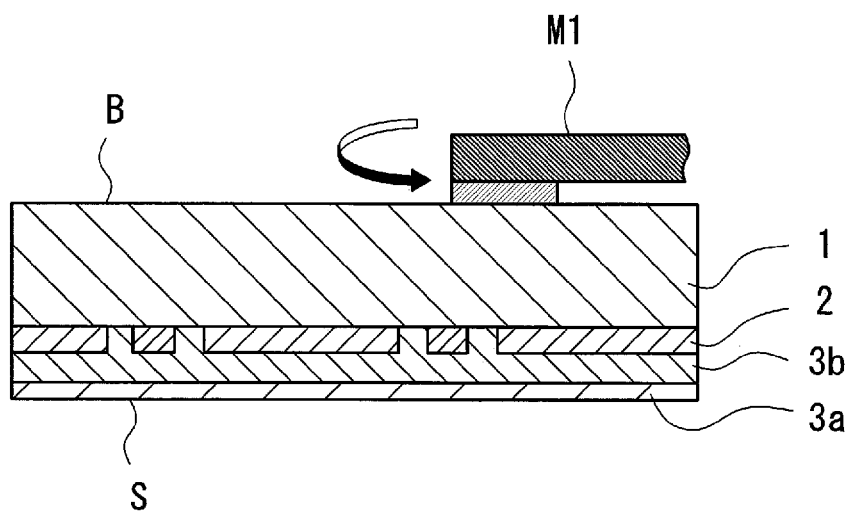
FIGS. 3(a) to 3(c) are schematic cross-sectional views illustrating steps up to thinning and fixing of the semiconductor wafer using the mask-integrated surface protective tape of the present invention. In the views, fragmentary
Figure 3B:
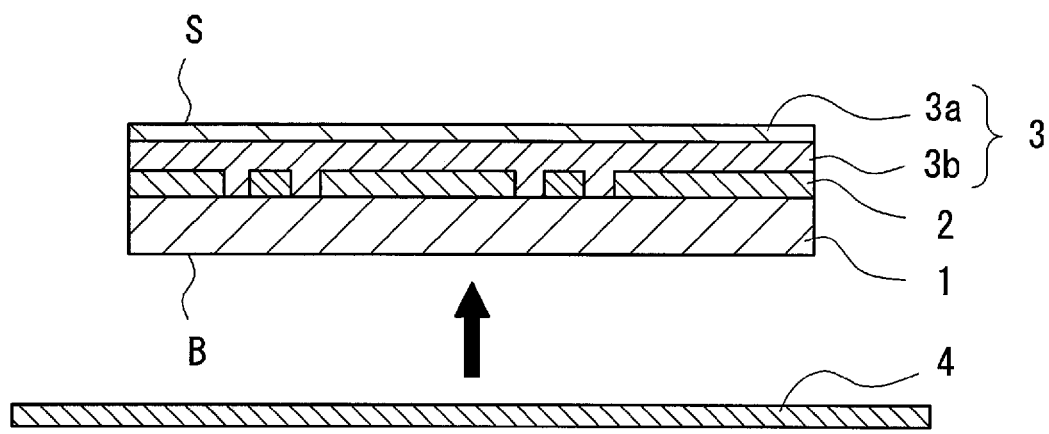
Figure 3C:
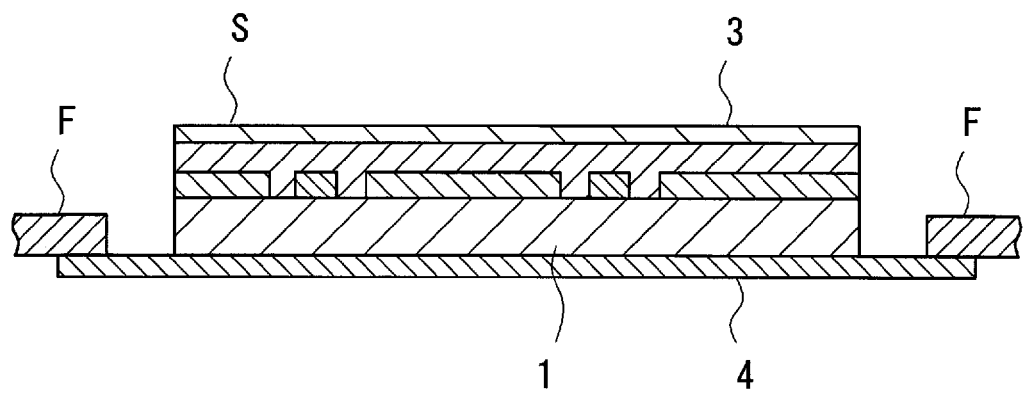

Then, the backing-face side B of the semiconductor wafer 1 is ground as arrow shown in FIG. 3(a) by a wafer-grinding apparatus M1, thereby thinning a thickness of the semiconductor wafer 1 (see FIG. 3(a)). On the ground backing-face side B, a wafer-fixing tape 4 is laminated in the arrow direction shown in FIG. 3(b) (see FIG. 3(b)), thereby supporting and fixing the wafer to a ring flame F (see FIG. 3(c)).

Figure 4A:
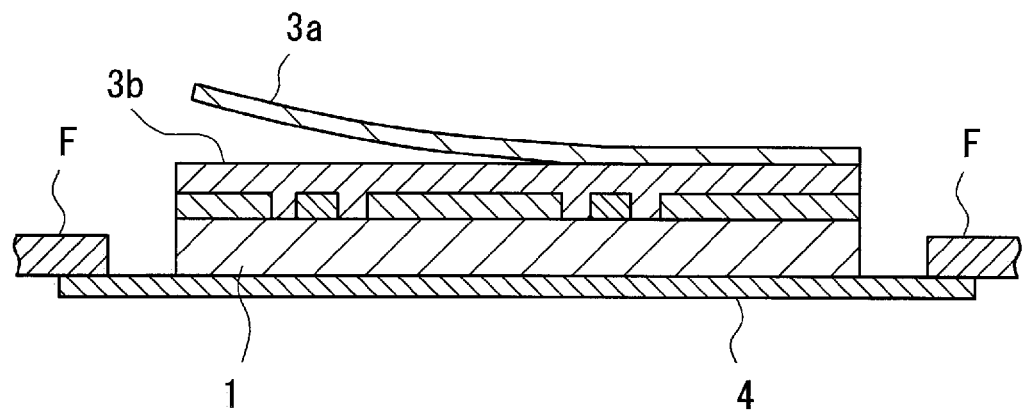
FIGS. 4(a) to 4(c) are schematic cross-sectional views illustrating steps up to the mask formation using the mask-integrated surface protective tape of the present invention. In the views, fragmentary
Figure 4B:
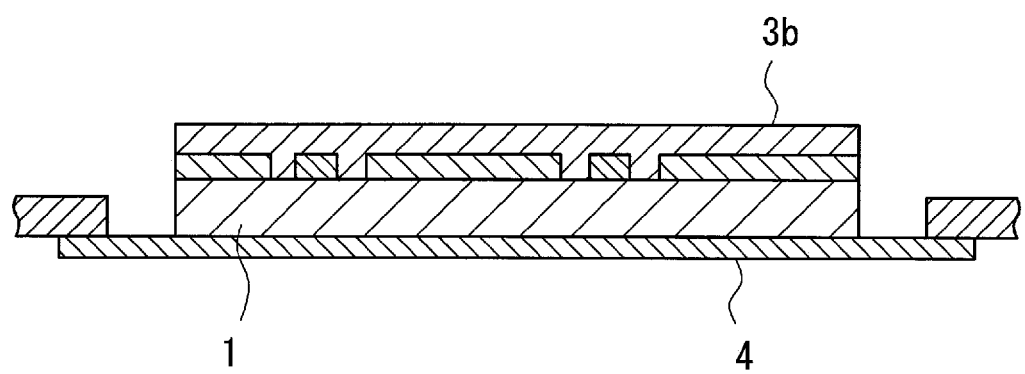
Figure 4C:
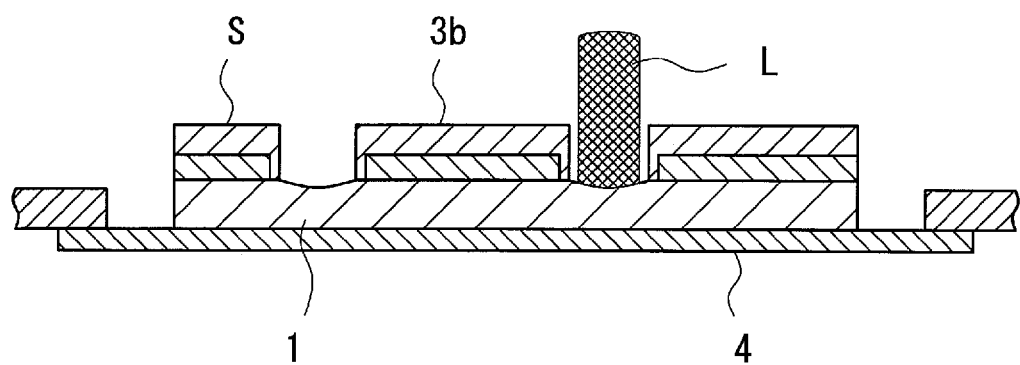

The base film 3a of the mask-integrated surface protective tape 3 is peeled from the semiconductor wafer 1, while leaving the mask material layer 3b on the semiconductor wafer 1 (see FIG. 4(a)), so that the mask material layer 3b is exposed (uncovered) (see FIG. 4(b)). Further, $CO_2$ laser L is irradiated from the surface S side toward a plurality of streets (not shown) appropriately formed in a grid pattern or the like on the patterned face 2, thereby to remove a portion corresponding to the streets of the mask material layer 3b, so that the streets of the semiconductor wafer are opened (see FIG. 4(c)).

Figure 5A:
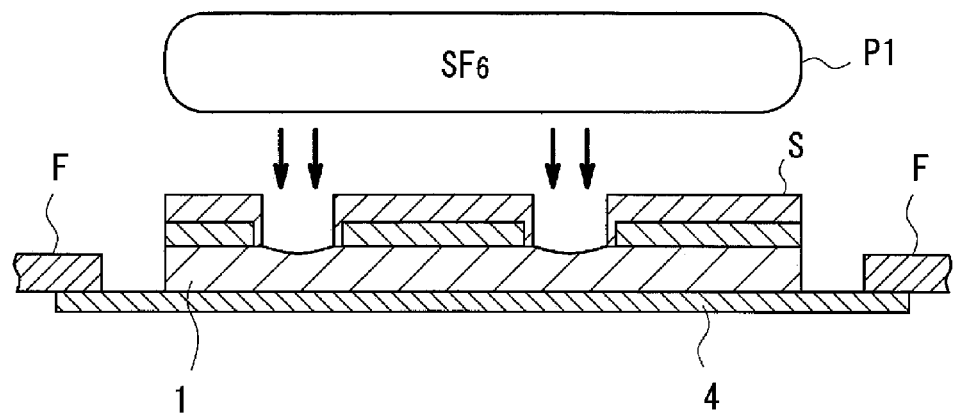
FIGS. 5(a) to 5(c) are schematic cross-sectional views illustrating the plasma dicing and plasma ashing steps using the mask-integrated surface protective tape of the present invention. In the views, fragmentary
Figure 5B:
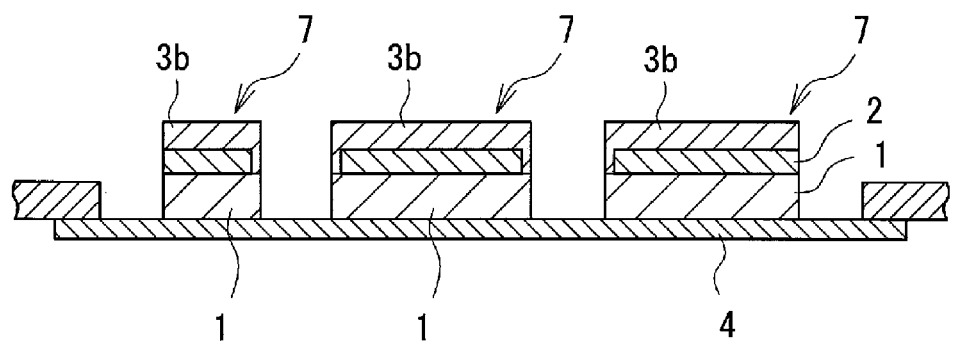
Figure 5C:
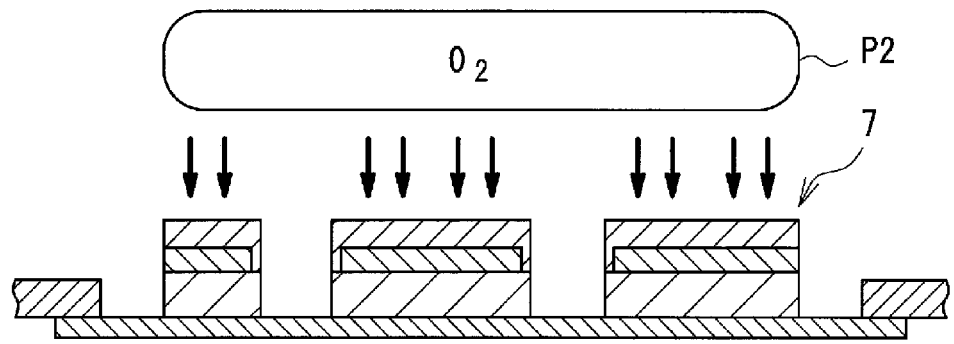
Figure 6A:
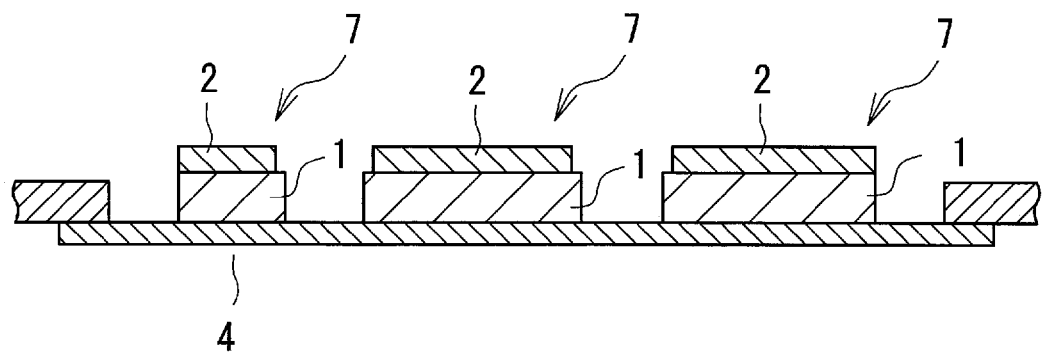
FIGS. 6(a) and 6(b) are schematic cross-sectional views illustrating steps up to picking up a chip using the mask-integrated surface protective tape of the present invention. In the views, fragmentary
Figure 6B:
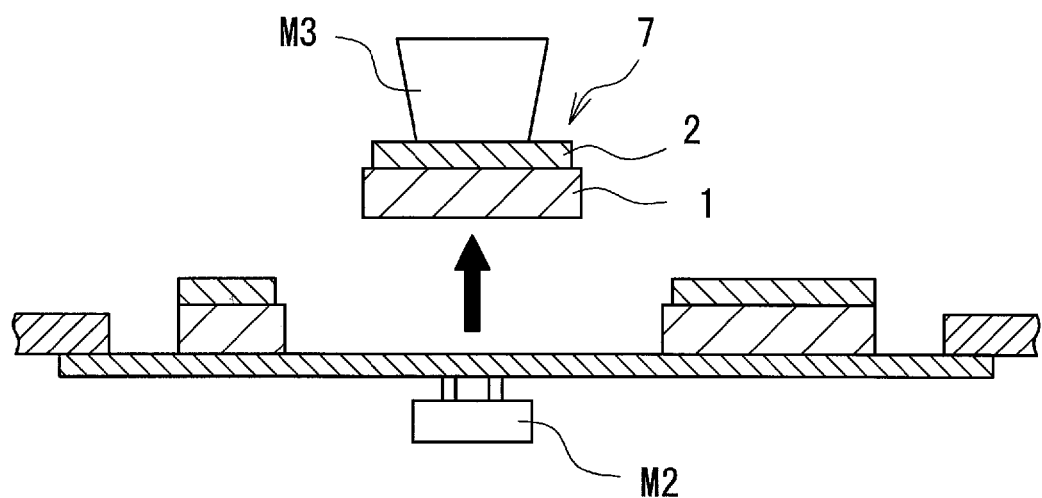

Then, a treatment by the plasma P1 of $SF_6$ gas is carried out from the surface S side, thereby to etch the semiconductor wafer 1 which has been exposed at the street portion (see FIG. 5(a)), and the semiconductor wafer is divided into individual chips 7, which results in singulation (see FIG. 5(b)). After that, ashing by plasma P2 of $O_2$ gas is carried out (see FIG. 5(c)), thereby to remove the mask material layer 3b remaining on the surface S (see FIG. 6(a)). Then, at last, the singulated chip 7 is knocked up by a pin M2, and is picked up in the arrow direction shown in FIG. 6(b) by adsorption with a collet M3 (see FIG. 6(b)). The arrows in FIGS. 5(a) and 5(c) each indicate a direction of the plasma irradiation.

Herein, a process of etching of Si of the semiconductor wafer by the use of $SF_6$ gas is also called as a BOSCH process. This process allows a reaction of the exposed Si and a fluorine atom formed from a plasmarized $SF_6$, thereby to remove the exposed Si as silicon tetrafluoride ($SiF_4$), which is also called as reactive ion etching (RIE). On the other hand, the removal by $O_2$ plasma is a method which is also used as plasma cleaner in the course of a semiconductor production process, and is also called as ashing (ash-making), which is one of means for removal of the organic substance. This method is carried out in order to clean an organic substance residue remaining on a semiconductor device surface.

Next, materials used in the mask-integrated surface protective tape 3 and materials used in the above-described steps are explained.

Meanwhile, the materials used in the above-described steps other than the materials used in the mask-integrated surface protective tape 3 are not limited to those materials explained below.

The semiconductor wafer 1 is a silicon wafer, on its one side, having the patterned face 2 on which the circuit or the like of the semiconductor device is formed. The patterned face 2 is a face on which the circuit or the like of the semiconductor device is formed, which has a street in a planar view.

The mask-integrated surface protective tape 3 of the present invention has a constitution in which the mask material layer 3b has been provided on the base film 3a, and has a function to protect the semiconductor device formed on the patterned face 2. Specifically, at the wafer-thinning step (backgrinding step) which is a post-step, while supporting the semiconductor wafer 1 by the patterned face 2, the backing-face side of the wafer is ground. Therefore, the mask-integrated surface protective tape 3 needs to withstand a load in grinding. For this reason, the mask-integrated surface protective tape 3 is different from a simple resist film or the like, and has a thickness enough to coat the device formed on the patterned face, a low pressing resistance, and a high adhesiveness that can adhere tightly to the device whereby the infiltration of dusts, grinding water, and the like is not occurred in grinding.

The base film 3a of the mask-integrated surface protective tape 3 of the present invention is characterized by that the wetting tension at the surface of the base film 3a from which the mask material layer 3b has been peeled, is 20.0 mN/m or more and 48.0 mN/m or less. The above-described "wetting tension" means a surface free energy per unit area. Said "wetting tension" can be measured with a surface tension determination reagent (for example, TENSION CHECKER LIQUID (trade name: manufactured by Kasuga Electric Works, Ltd.)). Further, said "wetting tension" test standard complies with "JIS K6768 (Plastic-film and sheet-wetting tension test method)".

By setting the wetting tension at the surface of the base film 3a from which the mask material layer 3b has been peeled, to the above-described range, the mask-integrated surface protective tape 3 of the present invention allows easy peeling of the mask material layer from the base film. From this viewpoint, the wetting tension of the base film 3a on the side from which the mask material layer 3b has been peeled, is 20.0 mN/m or more and 48.0 mN/m or less, preferably 22.6 mN/m or more and 45.0 mN/m or less, and more preferably 25.4 mN/m or more and 44.0 mN/m or less.

When the above-described wetting tension is too small, there is a possibility that the base film 3a and the mask material layer 3b will peel from each other in equipment for laminating the mask-integrated surface protective tape 3 on the semiconductor wafer 1. On the other hand, when the above-described wetting tension is too large, an adhesion force between the base film 3a and the mask material layer 3b is too increased to peel, so that it becomes difficult to expose only the mask material layer on the wafer surface.

Further, the mask-integrated surface protective tape 3 of the present invention is characterized by that the surface roughness Ra at the surface of the base film 3a from which the mask material layer 3b has been peeled, is 0.05 μm or more and 2.0 μm or less, when measured in conformity to J1S B0601. When the surface roughness Ra is larger than 2.0 μm, because the contact area between the base film 3a and the mask material layer 3b increases, an adhesion force is too increased, so that peeing becomes difficult. Vice versa, when the surface roughness Ra is less than 0.05 μm, although a peeling property between the base film 3a and the mask material layer 3b is improved, there is a possibility that the base film 3a and the mask material layer 3b peel from each other in equipment for laminating a tape as described above, or during grinding, so that the wafer is damaged. From this viewpoint, the surface roughness Ra is preferably 0.07 μm or more and 1.8 μm or less, more preferably 0.09 μm or more and 1.7 μm or less and particularly preferably 0.11 μm or more and 1.6 μm or less.

Meanwhile, the surface roughness Ra in the present invention means an average roughness obtained by measuring and calculating a surface roughness of the base film using P-10 (trade name) manufactured by KLA-Tencor.

The mask-integrated surface protective tape 3 of the present invention is characterized by that the surface of the base film 3a from which the mask material layer 3b has been peeled meets both conditions of the above-described wetting tension and surface roughness Ra. The expression "the surface of the base film 3a from which the mask material layer 3b has been peeled" means a counterface surface of the base film 3a to the mask material layer 3b after peeling the mask material layer 3b from the base film 3a in the mask-integrated surface protective tape of the present invention. By meeting both conditions of the above-described wetting tension and surface roughness but not either condition of them, the scope of the choices for the mask materials can be widened to a large extent. With the surface roughness of the base film meeting the above-described condition, the contact area between the base film and the mask material layer can be reduced physically. This allows choices of flexible materials which can be well closely attached even to a semiconductor wafer having a large patterned asperity at the surface thereto.

Further, with the wetting tension meeting the above-described condition, easy peeling becomes possible, even when a mask material, which has good compatibility to materials coated on the surface of a semiconductor wafer and has chemically high polarity, is applied. That is, with the base film meeting both conditions, a mask material which can be well closely attached to the surface of a semiconductor wafer can be chosen. After grinding, it becomes possible to peel physically and chemically only a base film with ease. This allows compatibilization of protectability and pealability of the patterned surface of the wafer.

Further, the Young's modulus of the base film 3a is preferably $2.0 \times 10^7$ Pa or more and $7.0 \times 10^9$ Pa or less, and more preferably $2.5 \times 10^7$ Pa or more and $6.0 \times 10^9$ Pa or less. By setting the Young's modulus of the base film within this range, the mask-integrated surface protective tape 3 is able to have an adequate cushion in grinding, whereby breakage of the wafer can be suppressed to a large extent.

The base film 3a is composed of plastic, gum or the like. Examples of these materials include polyolefin resins such as polyethylene, polypropylene, and ethylene-propylene copolymer, homopolymers or copolymers of α-olefin, such as polybutene-1, poly-4-methylpentene-1, ethylene-vinyl acetate copolymer, ethylene-acryl acid copolymer, and ionomer, or a mixture thereof, an elemental substance or a mixture thereof, such as polyethylene terephthalate, polyethylene naphthalate, polyphenylene sulfide, polyether imide, polyimide, polycarbonate, polymethyl methacrylate, polyurethane, and styrene-ethylene-butene or pentene-based copolymer, and a resin composition of these resins to which a resin other than these resins, a filler, additives or the like have been blended. These materials may be chosen depending on the required characteristics.

The base film 3a preferably has a layer composed of a polyolefin resin. In this case, the base film 3a may be a single layer composed of a polyolefin resin layer, or a multi-layer structure of 2 or more layers composed of a polyolefin resin layer and other resin layer(s). Further, a laminate of a low-density polyethylene and ethylene-vinyl acetate copolymer; a laminate of polypropylene and polyethylene terephthalate; polyethylene terephthalate; or polyethylene naphthalate is one of preferable materials.

In a case where the base film 3a is a single layer or a multi-layer structure of 2 or more layers, the melting point of the resin disposed on the side of the base film opposite to the mask material layer is preferably a range of 80° C. or more and 120° C. or less, and more preferably a range of 90° C. or more and 110° C. or less. By disposing a resin having the above-described range of the melting point, a peeling film can be heat-sealed with certainty and it becomes possible to peel easily.

These base films 3a can be produced using a common extrusion method. In a case of obtaining the base film 3a by laminating various resins, these are produced by a co-extrusion method, a lamination method or the like. On this occasion, as usually performed in the production method of a common laminate film, an adhesive layer may be disposed between resins. The thickness of the forgoing base film 3a is preferably from 20 to 200 μm from the viewpoint of strength or elongation characteristics and radiotransparency.

The mask material layer 3b takes a role in protection of the patterned surface by absorbing an asperity of the device formed on the patterned surface, thereby to enhance adhesion property to the patterned surface. In order to make the mask-integrated surface protective tape withstand a load of the wafer-thinning step, it is preferable that the adhesion property of the mask material layer 3b to a base film 3a in the wafer-thinning step is high. On the other hand, after the wafer-thinning step, because the mask material layer 3b is peeled from the base film 3a, it is preferable that the adhesion property is low (high peeling property is preferable). In order to achieve these properties in higher level, it is preferable that a mask material of the mask material layer 3b of the mask-integrated surface protective tape of the present invention has temporary-adhesiveness (stickiness) and is of radiation curing type. By rendering the mask material radiation-curing type, the adhesive force between the base film 3a and the mask material layer 3b reduces by radiation irradiation. For this reason, the mask material layer 3b can be simply peeled from the base film 3a.

Meanwhile, in the present specification, the term "radiation" is a concept including both a light beam such as ultraviolet, and an ionizing radiation such as an electron beam. In the present invention, the radiation is preferably ultraviolet.

In the mask-integrated surface protective tape of the present invention, the mask material layer 3b contains a (meth)acrylic copolymer. Herein, the phrase "the mask material layer 3b contains a (meth)acrylic copolymer" means to incorporate an embodiment in which the (meth) acrylic copolymer exists in a reacted state with a curing agent described below.

Herein, the brackets expression "(meth)" as described in the (meth)acrylic series means that this may or may not present. For example, the (meth)acrylic series may be any of an acrylic series, a meth acrylic series and a combination of these series.

In the present invention, examples of the (meth)acrylic copolymer include a copolymer having a (meth)acrylic acid ester as a constituent, or a mixture of these copolymers.

The mass-average molecular weight of these polymers is normally about 300,000 to 1,000,000.

A proportion of the (meth)acrylic acid ester component of the total monomer component of the (meth)acrylic copolymer is preferably 70% or more, more preferably 80% or more, and still more preferably 90% or more. Further, in a case where the proportion of the (meth)acrylic acid ester component of the total monomer component of the (meth) acrylic copolymer is not 100% by mole, it is preferable that the remaining monomer component is a monomer component [(meth)acrylic acid and the like] existing in the form of (meth)acryloyl group polymerized as a polymerizable group.

Further, the proportion of the (meth)acrylic acid ester component having a functional group (for example, hydroxyl group) reacting with a curing agent described below, of the total monomer component of the (meth)acrylic copolymer is preferably 1% by mole or more, more preferably 2% by mole or more, further more preferably 5% by mole or more, and still further more preferably 10% by mole or more. A proportion of the (meth)acrylic acid ester component is preferably 35% by mole or less and more preferably 25% by mole or less.

The above-described (meth)acrylic acid ester component may be a (meth)acrylic acid alkyl ester (also referred to as alkyl (meth)acrylate). The number of carbon atoms of the alkyl group which constitutes the (meth)acrylic acid alkyl ester is preferably from 1 to 20, more preferably from 1 to 15, and further more preferably from 1 to 12.

The content (content converted to the state before reacting with a curing agent) of the (meth)acrylic copolymer in the mask material layer 3b is preferably 80% by mass or more, more preferably 90% by mass or more, and still more preferably from 95 to 99.9% by mass.

In a case where the mask material layer 3b is composed of a radiation-curing type temporary-adhesive, a temporary-adhesive containing an acrylic temporary-adhesive and a radiation-polymerizable compound may be preferably used.

The acrylic adhesive is a (meth)acrylic copolymer, or a mixture of a (meth)acrylic copolymer and a curing agent.

The curing agent is used to adjust a temporary-adhesive force and a cohesion force by reacting it with a functional group which the (meth)acrylic copolymer has.

Examples thereof include: an epoxy compound having 2 or more epoxy groups in the molecule (hereinafter, also referred to as "epoxy-series curing agent"), such as 1,3-bis (N,N-diglycidyl aminomethyl)cyclohexane, 1,3-bis(N,N- diglycidyl aminomethyl)toluene, 1,3-bis(N,N-diglycidyl aminomethyl)benzene, N,N,N',N'-tetraglycidyl-m-xylenediamine, ethylene glycol diglycidyl ether, or terephthalic acid diglycidyl ester acrylate; an isocyanate compound having 2 or more isocyanate groups in the molecule (hereinafter, also referred to as "isocyanate-series curing agent"), such as 2,4-tolylenediisocyanate, 2,6-tolylenediisocyanate, 1,3-xylylenediisocyanate, 1,4-xylylenediisocyanate, diphenylmethane-4,4'-diisocyanate, hexamethylene diisocyanate, isophorone diisocyanate, or an adduct type of these; an aziridine compound having 2 or more aziridinyl groups in the molecule (aziridine-series curing agent), such as tetramethylol-tri-β-aziridinyl propionate, trimethylol-tri-β-aziridinyl propionate, trimethylolpropane-tri-β-aziridinyl propionate, trimethylolpropane-tri-β-(2-methylaziridine) propionate, tris-2,4,6-(1-aziridinyl)-1,3,5-triazine, tris[1-(2-methyl)-aziridinyl] phosphine oxide, or hexa[1-(2-methyl) aziridinyl] triphosphatriazine; and the like.

An addition amount of the curing agent may be adjusted depending on a desired temporary-adhesion force, and is suitably from 0.1 to 5.0 mass parts with respect to 100 mass parts of the (meth)acrylic copolymer. In the mask material layer of the mask-integrated surface protective tape of the present invention, the curing agent is in the state of having reacted with the (meth)acrylic copolymer.

As for the radiation-polymerizable compound described above, a low-molecular weight compounds having, in the molecule, at least two or more photopolymerizable carbon-carbon double bonds which can be three-dimensionally reticulated by radiation irradiation are widely used.

Specifically, use may be widely applicable of acrylate-based compounds, such as trimethylolpropane triacrylate, tetramethylolmethane tetraacrylate, pentaerythritol triacrylate, pentaerythritol tetraacrylate, dipentaerythritol monohydroxypentaacrylate, dipentaerythritol hexaacrylate, 1,4-butyleneglycol diacrylate, 1,6-hexanediol diacrylate, polyethyleneglycol diacrylate, or oligo-ester acrylates.

Further, in addition to the acrylate-based compounds, a urethane acrylate-based oligomer can be also used.

The urethane acrylate-based oligomer is obtained: by conducting reaction of an acrylate or methacrylate having a hydroxyl group (for example, 2-hydroxyethyl acrylate, 2-hydroxyethyl methacrylate, 2-hydroxypropyl acrylate, 2-hydroxypropyl methacrylate, polyethyleneglycol acrylate, polyethyleneglycol methacrylate, and the like) with a urethane prepolymer having an isocyanate group at the end thereof, which is obtained by conducting reaction of a polyol compound, such as a polyester type- or a polyether type-polyol, and a polyvalent isocyanate compound (for example, 2,4-tolylene diisocyanate, 2,6-tolylene diisocyanate, 1,3-xylylene diisocyanate, 1,4-xylylene diisocyanate, diphenyl methane-4,4'-diisocyanate, and the like).

As a blending ratio of the acrylic temporary-adhesive and the radiation-polymerizable compound in the radiation-curing type mask material, the radiation-polymerizable compound is desirably blended in the range of 50 to 200 mass parts and preferably 50 to 150 mass parts with respect to 100 mass parts of the acrylic temporary-adhesive. If the blending ratio is in this range, the mask material layer has an adequate elastic modulus, so that it is possible to improve an adhesion property between an asperity on the wafer surface and the mask material layer.

Further, as the radiation-curing type temporary-adhesive to be used in the mask material layer 3b, it is also preferable to use a radiation-polymerizable (meth)acrylic copolymer in which the above-described (meth)acrylic copolymer itself has been rendered radiation-polymerizable.

In this case, the radiation-curing type temporary-adhesive may contain a curing agent.

The radiation-polymerizable (meth)acrylic copolymer is a copolymer having, in the molecule of the copolymer, a reactive group which is capable of realizing a polymerization reaction upon exposure to a radiation, particularly to an ultraviolet.

As the reactive group, an ethylenically unsaturated group, in other words, a group having a carbon-carbon double bond (ethylenically unsaturated bond), is preferred. Examples thereof include: a vinyl group, an allyl group, a styryl group, a (meth)acryloyloxy group, a (meth)acryloylamino group, and the like.

The introduction of the above-described reactive group to the copolymer may be performed, for example, by reacting a copolymer having a hydroxyl group with a compound having both a group (for example, isocyanate group) reacting with the hydroxyl group and the above-described reactive group [representatively 2-(methacryloyloxy)ethyl isocyanate].

It is preferable that a (meth)acrylic acid alkyl ester component of which the number of carbon atoms is from 8 to 12 is contained in the monomer components which constitute the (meth)acrylic copolymer having an ethylenically unsaturated bond at the side chain thereof, which constitutes the mask material layer 3b of the mask-integrated surface protective tape of the present invention. Of the monomer components which constitute the (meth)acrylic copolymer having an ethylenically unsaturated bond at the side chain thereof, the percentage of the (meth)acrylic acid alkyl ester component of which the number of carbon atoms is from 8 to 12 is preferably from 45 to 85% by mole, and more preferably from 50 to 80% by mole.

Further, in a case of conducting polymerization and curing of a mask material layer 3b by radiation, a photopolymerization initiator, for example, isopropylbenzoin ether, isobutylbenzoin ether, benzophenone, Michler's ketone, chlorothioxanthoine, benzyl methyl ketal, α-hydroxycyclohexyl phenyl ketone, 2-hydroxymethylphenyl propane, and the like can be used. By adding at least one of these compounds to the mask material layer, a polymerization reaction can be efficiently accelerated.

The above-described mask material layer 3b may further contain a photosensitizer, any of known tackifiers (temporary-adhesion provider), softeners, antioxidants, or the like.

As for the mask material layer 3b, those embodiments described at paragraphs [0036] to [0055] of JP-A-2014-192204 are also preferably applied.

The thickness of the mask material layer 3b is preferably from 5 to 100 μm, from the viewpoint of more increasing protective ability to the device and the like formed on the patterned surface 2, and more increasing adhesion property to the patterned surface. In this regard, depending on the variety of the device, an asperity of the patterned surface is approximately about a few micrometers to about 50 μm.

In the mask-integrated surface protective tape of the present invention, it is preferable that the thickness of the mask material layer is larger than the patterned asperity of the semiconductor wafer. This allows further increase in adhesion property to the patterned surface of the semiconductor wafer which has been subjected to backgrinding for thinning.

Further, in the mask-integrated surface protective tape of the present invention, the asperity at the patterned surface of the semiconductor wafer which will be laminated therewith is preferably 10 μm or more, more preferably 15 μm or more, and still more preferably 20 μm or more.

Further, in the mask-integrated surface protective tape of the present invention, water resistance at the surface of the mask material layer becomes important. In a case where water resistance at the surface of the mask material layer is low, by the infiltration of grinding water in wafer backgrinding processing, wafer contamination is triggered and an edge chipping is triggered since the mask-integrated surface protective tape tends to peel from the wafer edge. Accordingly, in the mask-integrated surface protective tape of the present invention, it is desirable that water resistance at the surface of the mask material layer is high. Specifically, the contact angle with pure water at the surface of the mask material layer is preferably 85° or more. From the viewpoint of material characteristics of the mask material, the contact angle with pure water is ordinarily controlled to 150° or less. In practice, the contact angle with pure water at the surface of the mask material layer is about from 85° to 120°. Meanwhile, the measurement environment of the contact angle is controlled to room temperature (25±5° C.) and humidity of 50±10%.

In the present invention, the contact angle with pure water at the surface of the mask material layer means a contact angle immediately after contact between the surface of the mask material layer and pure water. This contact angle is a value obtained by measurement at the temperature of 23° C. and humidity of 50%. Measurement can be carried out using a commercially available contact angle measuring apparatus. Meanwhile, specific examples of the commercially available "contact angle measuring apparatus" include "FACE CONTACT ANGLE METER CA-S150 TYPE (trade name), manufactured by Kyowa Chemical Industry Co., Ltd.".

Further, the storage elastic modulus of the mask material layer at 23° C. is preferably $2.0 \times 10^4$ Pa or more and $1.2 \times 10^5$ Pa or less, more preferably $2.5 \times 10^4$ Pa or more and $1.0 \times 10^5$ Pa or less, and still more preferably $3.0 \times 10^4$ Pa or more and $9.0 \times 10^4$ Pa or less. By having this storage elastic modulus, the mask material layer can follow the asperity on the surface of the wafer and allows reduction of the possibility of infiltration of grinding water in grinding.

Further, in the storage elastic modulus, there are G' (torsional shear method) and E' (tension and compression method) depending on the measurement method. The elastic modulus of the non-radiation-curing type mask material layer or the radiation-curing type mask material layer before radiation irradiation can be measured by a torsional shear method. The elastic modulus of the radiation-curing type mask material layer after radiation irradiation can be measured by a tension and compression method. Relationships of E'=3G' are generally established between G' and E' in the linear region. The above-described elastic modulus defined by the present invention means a value measured by the torsional shear method. When measured by the tension and compression method, the elastic modulus indicates a value converted by the formula of E'=3G'.

Further, the storage elastic modulus of the mask material layer at 50° C. is preferably $1.0 \times 10^4$ Pa or more and $1.0 \times 10^5$ Pa or less. By having such storage elastic modulus, when the mask-integrated surface protective tape is laminated on the semiconductor wafer, the mask material layer becomes easy to closely adhere to the asperity of the wafer surface and allows further reduction in contamination of the wafer. Further, since the mask material becomes more flexible by increasing the temperature from 23° C. to 50° C., the mask material becomes easy to follow the asperity of the wafer surface.

In the mask-integrated surface protective tape of the present invention, the adhesion force between the base film layer 3a and the mask material layer 3b is preferably 0.01 N/25 mm or more and 0.5 N/25 mm or less. By having this adhesion force, backgrinding of the conductor wafer can be carried out successfully. When peeling the base film 3a from the thinned conductor wafer after the backgrinding processing, it becomes possible to peel it off without damage or the like of the wafer.

In the present invention, the term "adhesion force" (unit: N/25 mm) is obtained by making a 5-mm width incision in a mask-integrated surface protective tape with a cutter, and then pulling a mask material layer at a peeling rate of 300 mm/min in the direction of 180° to peel the mask material layer away from the mask-integrated surface protective tape, and measuring a stress (peeling strength) at that moment, using a TENSILON tester [AG-10kNI (trade name), manufactured by Shimadzu Corporation].

The measurement of the above-described adhesion force is conducted under the conditions that an ultraviolet ray is irradiated to all over the mask-integrated surface protective tape from the base film side of the tape so that the accumulated radiation dose gets to 500 mJ/cm$^2$. A high-pressure mercury lamp is used for the ultraviolet irradiation.

The wafer-fixing tape 4 is necessary to hold the semiconductor wafer 1 and to have resistance to plasma which is sustainable even if the wafer-fixing tape is subjected to the plasma dicing step. Further, in the picking-up step, a good picking-up property and also, in some cases, an expansion property and the like are required.

As the foregoing wafer-fixing tape 4, a tape similar to the base material tape 3a may be used. Further, use may be made of any of known dicing tapes used in a conventional plasma dicing method, which are generally called as a dicing tape. Further, the use can be also made of a dicing die-bonding tape, in which an adhesion bond for die-bonding is laminated on the temporary-adhesive layer, in order to make it easy to transit to the die-bonding step after picking-up.

For the laser irradiation by which the mask material layer 3b is cut, use can be made of a laser irradiator for irradiating an ultraviolet or infrared laser light. In this laser irradiator, a laser irradiation part capable of freely moving along the street of the semiconductor wafer 1 is arranged. Laser can be irradiated, which is provided with an output controlled suitably to remove the mask material layer 3b. In particular, by $CO_2$ laser, it is possible to obtain a large power of several to several tens of watts. $CO_2$ laser can be preferably used for the present invention.

In order to carry out the plasma dicing and the plasma ashing, a plasma-etching apparatus can be used. The plasma-etching apparatus is an apparatus, which is capable of subjecting the semiconductor wafer 1 to dry etching, and in which a sealed treatment space is made in a vacuum chamber, to place the semiconductor wafer 1 on the side of the electrode for a high-frequency wave. A gas for plasma generation is supplied from the side of a gas-supplying electrode provided facing the electrode for high-frequency wave. When a high-frequency voltage is applied to the electrode for a high-frequency wave, plasma is generated between the gas-supplying electrode and the electrode for a high-frequency wave. Therefore, the resultant plasma is used. A refrigerant is circulated in a heat-producing electrode for high-frequency wave to prevent the temperature rise of the semiconductor wafer 1 due to the heat of this plasma.

In accordance with the method of producing the semiconductor chip (the method of processing the semiconductor wafer), a photolithographic step or the like for forming a resist which was used in the conventional plasma dicing process becomes unnecessary by giving a mask function in the plasma dicing to the mask-integrated surface protective tape of the present invention which protects the patterned face. In particular, use of the mask-integrated surface protective tape of the present invention eliminates a technique such as printing and transcription, which requires a high level of alignment for the mask formation. As a result, the mask-integrated surface protective tape of the present invention can be easily laminated on the semiconductor wafer surface, and a mask can be easily and accurately formed by the laser equipment.

Further, the mask material layer 3b can be removed by $O_2$ plasma, and therefore removal of the mask portion can be carried out by the same apparatus as the plasma dicing apparatus. In addition, the plasma dicing is carried out from the patterned face 2 side (surface S side), and therefore it is not necessary to turn the chip upside down before the picking-up operation.

From these reasons, the facilities can be simplified, and process costs can be considerably suppressed.

EXAMPLES

The present invention will be described in more detail based on examples given below, but the invention is not meant to be limited by these.

Example 1

Preparation of Mask-Integrated Surface Protective Tape and Production of Semiconductor Chip <Preparation of Mask-Integrated Surface Protective Tape>
1 mole % of methacrylic acid, 78 mole % of 2-ethylhexyl acrylate and 21 mole % of 2-hydroxyethyl acrylate were mixed. The mixture was subjected to a solution polymerization, to obtain a solution of (meth)acrylic copolymer having a mass-average molecular weight of 700,000.

To the obtained (meth)acrylic copolymer, 2-methaclyroyloxyethyl isocyanate (trade name: KARENZ MOI manufactured by Showa Denko K.K.) was adjoined, to obtain a (meth)acrylic copolymer having the following physical properties.
(Mass-average molecular weight: 700,000, double bonding amount: 0.90 meq/g, hydroxyl group value: 33.5 mg KOH/g, acid value: 5.5 mg KOH/g, and Tg: −68° C.)

To 100 mass parts of this ethylenically unsaturated group-containing (meth)acrylic copolymer, 0.2 mass parts of COLONATE L (trade name: isocyanate-series curing agent, manufactured by Nippon Polyurethane Industry Co., Ltd.) as a curing agent, and 5 mass parts of IRGACURE 184 (trade name: manufactured by BASF) as a photopolymerization initiator, were blended, to obtain a mask material composition A.

Using ethylene-vinyl acetate copolymer (trade name: ULTRATHENE 541, manufactured by Tosoh Corporation), 100 μm-thick base film 3a was prepared by a T die method through a processing with embossing rolls (Shibo rolls) which give the surface roughness Ra of 1.1 μm to the surface on which the above-described mask material composition A will be laminated, and a corona treatment performed so that the wetting tension is 22.6 mN/m.

The above-described mask material composition A was coated on a peeling liner, to form a mask material layer 3b, and the formed mask material layer was laminated on the base film 3a, to obtain a 130 μm-thick ultraviolet-curing type mask-integrated surface protective tape 3.

<Production of Semiconductor Chip>
The above-obtained ultraviolet-curing type mask-integrated surface protective tape was laminated on the surface of a silicon wafer (diameter: 8 inches) having thereon scribe lines (streets) using a laminator DR8500III (trade name, manufactured by Nitto Seiki Co., Ltd.).

After that, the surface (wafer backing-face side) opposite to the surface on which the above-described mask-integrated surface protective tape was laminated, was ground using DGP8760 (trade name, manufactured by DISCO Corporation) until a thickness of the wafer got to 50 μm. The ground wafer with the mask material was mounted on a dicing tape from the wafer backing-face side using RAD-2700F (trade name, manufactured by Lintec Corporation), and was supported and fixed to a ring flame. Further, by irradiating an ultraviolet ray of 500 mJ/cm$^2$ using a high-pressure mercury lamp from the side of the ultraviolet-curing type mask-integrated surface protective tape, an adhesion force between the base film 3a and the mask material layer 3b was reduced. In this way, only the base film 3a was peeled, while leaving only the mask material layer 3b on the wafer. Next, the mask material on the scribe line was removed by a $CO_2$ laser to form an opening on the scribe line.

After that, the silicon wafer was subjected to a plasma irradiation by a $SF_6$ gas as a plasma-generating gas from the mask material layer side at an etching rate of 15 μm/min for 5 minutes. By this plasma dicing, the wafer was cut and divided into individual chips. Then, the chips were subjected to ashing by an $O_2$ gas as a plasma-generating gas at an etching rate of 1.5 μm/min for 10 minutes, thereby to remove the mask material. After that, an ultraviolet ray was irradiated (irradiation dose: 200 mJ/cm$^2$) from the dicing tape side thereby to lower a temporary-adhesion force of the dicing tape, and a chip was picked up.

In the above-described Example 1, the wetting tension of the base film 3a at the surface from which the mask material layer 3b had been peeled was measured. As a result, it was confirmed that the wetting tension was 22.6 N/m. Further, it was confirmed that the surface roughness Ra at the same surface as the forgoing was 1.1 μm.

Example 2

Preparation of Mask-Integrated Surface Protective Tape and Production of Semiconductor Chip <Preparation of Mask-Integrated Surface Protective Tape>
A mask material composition B was obtained in the same manner as in Example 1, except that the amount of COLONATE L in the mask material composition A prepared in Example 1 was changed to 4 mass parts.

Using ethylene-vinyl acetate copolymer (trade name: ULTRATHENE 530, manufactured by Tosoh Corporation), 100 μm-thick base film 3a was prepared by a T die method through a processing with embossing rolls which give the surface roughness Ra of 0.9 μm to the surface on which the above-described mask material composition B will be laminated, and a corona treatment performed so that the wetting tension is 48.0 mN/m.

The above-described mask material composition B was coated on a peeling liner to form a mask material layer 3b, and the formed mask material layer was laminated on the base film 3a, to obtain a 130 μm-thick ultraviolet-curing type mask-integrated surface protective tape 3.

<Production of Semiconductor Chip>

The above-obtained ultraviolet-curing type mask-integrated surface protective tape was laminated on the surface of a silicon wafer (diameter: 8 inches) having thereon scribe lines (streets) using a laminator DR8500III (trade name, manufactured by Nitto Seiki Co., Ltd.).

After that, the surface (wafer backing-face side) opposite to the surface on which the above-described mask-integrated surface protective tape was laminated, was ground using DGP8760 (trade name, manufactured by DISCO Corporation) until a thickness of the wafer got to 50 µm. The ground wafer with the mask material was mounted on a dicing tape from the wafer backing-face side using RAD-2700F (trade name, manufactured by Lintec Corporation), and was supported and fixed to a ring flame. Further, by irradiating an ultraviolet ray of 500 mJ/cm$^2$ using a high-pressure mercury lamp from the side of the ultraviolet-curing type mask-integrated surface protective tape, an adhesion force between the base film 3a and the mask material layer 3b was reduced. In this way, only the base film 3a was peeled, while leaving only the mask material layer 3b on the wafer. Then, the mask material on the scribe line was removed by a $CO_2$ laser, to form an opening on the scribe line.

After that, the silicon wafer was subjected to a plasma irradiation by a $SF_6$ gas as a plasma-generating gas from the mask material layer side at an etching rate of 15 µm/min for 5 minutes. By this plasma dicing, the wafer was cut and divided into individual chips. Then, the chips were subjected to ashing by an $O_2$ gas as a plasma-generating gas at an etching rate of 1.5 µm/min for 10 minutes, thereby to remove the mask material. After that, an ultraviolet ray was irradiated (irradiation dose: 200 mJ/cm$^2$) from the dicing tape side, thereby to lower a temporary-adhesion force of the dicing tape, and a chip was picked up.

In the above-described Example 2, the wetting tension of the base film 3a at the surface from which the mask material layer 3b had been peeled was measured. As a result, it was confirmed that the wetting tension was 48.0 N/m. Further, it was confirmed that the surface roughness Ra at the same surface as the forgoing was 0.9 µm.

Example 3

Preparation of Mask-Integrated Surface Protective Tape and Production of Semiconductor Chip <Preparation of Mask-Integrated Surface Protective Tape>

1 mole % of methacrylic acid, 23 mole % of butyl acrylate, 68 mole % of lauryl acrylate, and 8 mole % of 2-hydroxyethyl acrylate were mixed. The mixture was subjected to a solution polymerization, to obtain a solution of (meth)acrylic copolymer having a mass-average molecular weight: 650,000, acid value: 5.0 mg KOH/g, and Tg: −10° C.

To 100 mass parts of the obtained (meth)acrylic copolymer, 100 mass parts of a 5-functional urethane acrylate oligomer having a molecular weight of 1,500 [manufactured by Shin-Nakamura Chemical Co., Ltd.], 50 mass parts of a 3-functional urethane acrylate oligomer [manufactured by Shin-Nakamura Chemical Co., Ltd.], 3 mass parts of COLONATE L and 2 mass parts of Tetrad C (trade name: 1,3-bis(N,N-diglicidyl aminomethyl)cyclohexanone, manufactured by Mitsubishi Gas Chemical Company, Inc.) as a curing agent, and 10 mass parts of IRGACURE 184 (trade name: manufactured by BASF) as a photopolymerization initiator, were blended, to obtain a mask material composition C.

Using ethylene-vinyl acetate copolymer (trade name: ULTRATHENE 530, manufactured by Tosoh Corporation), 100 µm-thick base film 3a was prepared by a T die method through a processing with embossing rolls which give the surface roughness Ra of 0.06 µm to the surface on which the above-described mask material composition C will be laminated, and a corona treatment performed so that the wetting tension is 38.0 mN/m.

The above-described mask material composition C was coated on a peeling liner to form a mask material layer 3b, and the formed mask material layer was laminated on the base film 3a, to obtain a 130 µm-thick ultraviolet-curing type mask-integrated surface protective tape 3.

<Production of Semiconductor Chip>

The above-obtained ultraviolet-curing type mask-integrated surface protective tape was laminated on the surface of a silicon wafer (diameter: 8 inches) having thereon scribe lines (streets) using a laminator DR8500III (trade name, manufactured by Nitto Seiki Co., Ltd.).

After that, the surface (wafer backing-face side) opposite to the surface on which the above-described mask-integrated surface protective tape was laminated, was ground using DGP8760 (trade name, manufactured by DISCO Corporation) until a thickness of the wafer got to 50 µm. The ground wafer with the mask material was mounted on a dicing tape from the wafer backing-face side using RAD-2700F (trade name, manufactured by Lintec Corporation), and was supported and fixed to a ring flame. Further, by irradiating an ultraviolet ray of 500 mJ/cm$^2$ using a high-pressure mercury lamp from the side of the ultraviolet-curing type mask-integrated surface protective tape, an adhesion force between the base film 3a and the mask material layer 3b was reduced. In this way, only the base film 3a was peeled, while leaving only the mask material layer 3b on the wafer. Then, the mask material on the scribe line was removed by a $CO_2$ laser to form an opening on the scribe line.

After that, the silicon wafer was subjected to a plasma irradiation by a $SF_6$ gas as a plasma-generating gas from the mask material layer side at an etching rate of 15 µm/min for 5 minutes. By this plasma dicing, the wafer was cut and divided into individual chips. Then, the chips were subjected to ashing by an $O_2$ gas as a plasma-generating gas at an etching rate of 1.5 µm/min for 10 minutes, thereby to remove the mask material. After that, an ultraviolet ray was irradiated (irradiation dose: 200 mJ/cm$^2$) from the dicing tape side, thereby to lower a temporary-adhesion force of the dicing tape, and a chip was picked up.

In the above-described Example 3, the wetting tension of the base film 3a at the surface from which the mask material layer 3b had been peeled was measured. As a result, it was confirmed that the wetting tension was 38.0 N/m. Further, it was confirmed that the surface roughness Ra at the same surface as the forgoing was 0.06 µm.

Example 4

Preparation of Mask-Integrated Surface Protective Tape and Production of Semiconductor Chip <Preparation of Mask-Integrated Surface Protective Tape>

1 mole % of methacrylic acid, 35 mole % of methyl metacrylate, 62 mole % of 2-ethylhexy acrylate, and 2 mole % of 2-hydroxyethyl acrylate were mixed. The mixture was subjected to a solution polymerization, to obtain a solution of (meth)acrylic copolymer having a mass-average molecular weight: 200,000, acid value: 6.0 mg KOH/g, and Tg: −30° C.

To 100 mass parts of the obtained (meth)acrylic copolymer, 100 mass parts of a 5-functional urethane acrylate oligomer having a molecular weight of 1,500 [manufactured by Shin-Nakamura Chemical Co., Ltd.], 50 mass parts of a 3-functional urethane acrylate oligomer [manufactured by Shin-Nakamura Chemical Co., Ltd.], 5 mass parts of COLONATE L as a curing agent, and 5 mass parts of IRGACURE 184 (trade name: manufactured by BASF) as a photopolymerization initiator, were blended, to obtain a mask material composition D.

Using ethylene-vinyl acetate copolymer (trade name: ULTRATHENE 530, manufactured by Tosoh Corporation), 100 µm-thick base film 3a was prepared by a T die method through a processing with embossing rolls which give the surface roughness Ra of 1.9 µm to the surface on which the above-described mask material composition D will be laminated, and a corona treatment performed so that the wetting tension is 38.0 mN/m.

The above-described mask material composition D was coated on a peeling liner, to form a mask material layer 3b, and the formed mask material layer was laminated on the base film 3a, to obtain a 130 µm-thick ultraviolet-curing type mask-integrated surface protective tape 3.

<Production of Semiconductor Chip>

The above-obtained ultraviolet-curing type mask-integrated surface protective tape was laminated on the surface of a silicon wafer (diameter: 8 inches) having thereon scribe lines (street) using a laminator DR8500III (trade name, manufactured by Nitto Seiki Co., Ltd.).

After that, the surface (wafer backing-face side) opposite to the surface on which the above-described mask-integrated surface protective tape was laminated, was ground using DGP8760 (trade name, manufactured by DISCO Corporation) until a thickness of the wafer got to 50 µm. The ground wafer with the mask material was mounted on a dicing tape from the wafer backing-face side using RAD-2700F (trade name, manufactured by Lintec Corporation), and was supported and fixed to a ring flame. Further, by irradiating an ultraviolet ray of 500 mJ/cm$^2$ using a high-pressure mercury lamp from the side of the ultraviolet-curing type mask-integrated surface protective tape, an adhesion force between the base film 3a and the mask material layer 3b was reduced. In this way, only the base film 3a was peeled, while leaving only the mask material layer 3b on the wafer. Then, the mask material on the scribe line was removed by a $CO_2$ laser to form an opening on the scribe line.

After that, the silicon wafer was subjected to a plasma irradiation by a $SF_6$ gas as a plasma-generating gas from the mask material layer side at an etching rate of 15 µm/min for 5 minutes. By this plasma dicing, the wafer was cut and divided into individual chips. Then, the chips were subjected to ashing by an $O_2$ gas as a plasma-generating gas at an etching rate of 1.5 µm/min for 10 minutes, thereby to remove the mask material. After that, an ultraviolet ray was irradiated (irradiation dose: 200 mJ/cm$^2$) from the dicing tape side, thereby to lower a temporary-adhesion force of the dicing tape, and a chip was picked up.

In the above-described Example 4, the wetting tension of the base film 3a at the surface from which the mask material layer 3b had been peeled was measured. As a result, it was confirmed that the wetting tension was 38.0 N/m. Further, it was confirmed that the surface roughness Ra at the same surface as the forgoing was 1.9 µm.

Example 5

Preparation of Mask-Integrated Surface Protective Tape and Production of Semiconductor Chip <Preparation of Mask-Integrated Surface Protective Tape>

20 mole % of methacrylic acid, 70 mole % of butyl acrylate, and 10 mole % of methyl acrylate were mixed. The mixture was subjected to a solution polymerization, to synthesize an acrylic copolymer (mass-average molecular weight: 400,000, hydroxyl group value: 0 mg KOH/g, acid value: 9.8 mg KOH/g, and Tg: −23° C.).

To 100 mass parts of the obtained acrylic copolymer, 2 mass parts of TETRAD C (trade name: 1,3-bis(N,N-diglicidyl aminomethyl)cyclohexanone, manufactured by Mitsubishi Gas Chemical Company, Inc.) as a curing agent, was blended, to obtain a mask material composition E.

Using ethylene-vinyl acetate copolymer (trade name: ULTRATHENE 631, manufactured by Tosoh Corporation), 100 µm-thick base film 3a was prepared by a T die method through a processing with embossing rolls which give the surface roughness Ra of 0.9 µm to the surface on which the above-described mask material composition E will be laminated, and a corona treatment performed so that the wetting tension is 38.0 mN/m.

The above-described mask material composition E was coated on a peeling liner, to form a mask material layer 3b, and the formed mask material layer was laminated on the base film 3a, to obtain a 130 µm-thick ultraviolet-curing type mask-integrated surface protective tape 3.

<Production of Semiconductor Chip>

The above-obtained ultraviolet-curing type mask-integrated surface protective tape was laminated on the surface of a silicon wafer (diameter: 8 inches) having thereon scribe lines (streets) using a laminator DR8500III (trade name, manufactured by Nitto Seiki Co., Ltd.).

After that, the surface (wafer backing-face side) opposite to the surface on which the above-described mask-integrated surface protective tape was laminated, was ground using DGP8760 (trade name, manufactured by DISCO Corporation) until a thickness of the wafer got to 50 µm. The ground wafer with the mask material was mounted on a dicing tape from the wafer backing-face side using RAD-2700F (trade name, manufactured by Lintec Corporation), and was supported and fixed to a ring flame. Further, by irradiating an ultraviolet ray of 500 mJ/cm$^2$ using a high-pressure mercury lamp from the side of the ultraviolet-curing type mask-integrated surface protective tape, an adhesion force between the base film 3a and the mask material layer 3b was reduced. In this way, only the base film 3a was peeled, while leaving only the mask material layer 3b on the wafer. Then, the mask material on the scribe line was removed by a $CO_2$ laser to form an opening on the scribe line.

After that, the silicon wafer was subjected to a plasma irradiation by a $SF_6$ gas as a plasma-generating gas from the mask material layer side at an etching rate of 15 µm/min for 5 minutes. By this plasma dicing, the wafer was cut and divided into individual chips. Then, the chips were subjected to ashing by an $O_2$ gas as a plasma-generating gas at an etching rate of 1.5 µm/min for 10 minutes, thereby to remove the mask material. After that, an ultraviolet ray was irradiated (irradiation dose: 200 mJ/cm$^2$) from the dicing tape side, thereby to lower a temporary-adhesion force of the dicing tape, and a chip was picked up.

In the above-described Example 5, the wetting tension of the base film 3a at the surface from which the mask material layer 3b has been peeled was measured. As a result, it was confirmed that the wetting tension was 38.0 N/m. Further, it was confirmed that the surface roughness Ra at the same surface as the forgoing was 0.9 µm.

Comparative Example 1

Preparation of Mask-Integrated Surface Protective Tape and Production of Semiconductor Chip <Preparation of Mask-Integrated Surface Protective Tape>

1 mole % of methacrylic acid, 50 mole % of lauryl acrylate, 29 mole % of 2-hydroxyethyl acrylate, and 20 mole % of 2-ethylhexyl acrylate, were mixed. The mixture was subjected to a solution polymerization, to obtain a solution of (meth)acrylic copolymer having a mass-average molecular weight of 300,000.

To the obtained (meth)acrylic copolymer, 2-methaclyroyloxyethyl isocyanate (trade name: KARENZ MOI manufactured by Showa Denko K.K.) was adjoined, to obtain a (meth)acrylic copolymer having the following physical properties. (Mass-average molecular weight: 300,000, double bonding amount: 0.59 meq/g, hydroxyl group value: 55.6 mg KOH/g, acid value: 5.5 mg KOH/g, and Tg: −20° C.)

To 100 mass parts of this ethylenically unsaturated group-containing (meth)acrylic copolymer, 8 mass parts of COLONATE L (trade name: manufactured by Nippon Polyurethane Industry Co., Ltd.) as a curing agent, and 5 mass parts of IRGACURE 184 (trade name: manufactured by BASF) as a photopolymerization initiator, were blended, to obtain a mask material composition F.

Using ethylene-vinyl acetate copolymer (trade name: ULTRATHENE 640, manufactured by Tosoh Corporation), 100 μm-thick base film 3a was prepared by a T die method through a processing with embossing rolls which give the surface roughness Ra of 0.9 μm to the surface on which the above-described mask material composition F will be laminated, and a corona treatment performed so that the wetting tension is 54.0 mN/m.

The above-described mask material composition F was coated on a peeling liner, to form a mask material layer 3b, and the formed mask material layer was laminated on the base film 3a, to obtain a 130 μm-thick ultraviolet-curing type mask-integrated surface protective tape 3.

<Production of Semiconductor Chip>

The above-obtained ultraviolet-curing type mask-integrated surface protective tape was laminated on the surface of a silicon wafer (diameter: 8 inches) having thereon scribe lines (streets) using a laminator DR8500III (trade name, manufactured by Nitto Seiki Co., Ltd.).

After that, the surface (wafer backing-face side) opposite to the surface on which the above-described mask-integrated surface protective tape was laminated, was ground using DGP8760 (trade name, manufactured by DISCO Corporation) until a thickness of the wafer got to 50 μm. The ground wafer with the mask material was mounted on a dicing tape from the wafer backing-face side using RAD-2700F (trade name, manufactured by Lintec Corporation), and was supported and fixed to a ring flame. Further, by irradiating an ultraviolet ray of 500 mJ/cm$^2$ using a high-pressure mercury lamp from the side of the ultraviolet-curing type mask-integrated surface protective tape, an adhesion force between the base film 3a and the mask material layer 3b was reduced. In this way, only the base film 3a was peeled, while leaving only the mask material layer 3b on the wafer. Then, the mask material on the scribe line was removed by a $CO_2$ laser to form an opening on the scribe line.

After that, the silicon wafer was subjected to a plasma irradiation by a $SF_6$ gas as a plasma-generating gas from the mask material layer side at an etching rate of 15 μm/min for 5 minutes. By this plasma dicing, the wafer was cut and divided into individual chips. Then, the chips were subjected to ashing by an $O_2$ gas as a plasma-generating gas at an etching rate of 1.5 μm/min for 10 minutes, thereby to remove the mask material. After that, an ultraviolet ray was irradiated (irradiation dose: 200 mJ/cm$^2$) from the dicing tape side, thereby to lower a temporary-adhesion force of the dicing tape, and a chip was picked up.

In the above-described Comparative Example 1, the wetting tension of the base film 3a at the surface from which the mask material layer 3b had been peeled was measured. As a result, it was confirmed that the wetting tension was 54.0 N/m. Further, it was confirmed that the surface roughness Ra at the same surface as the forgoing was 0.9 μm.

Comparative Example 2

Preparation of Mask-Integrated Surface Protective Tape and Production of Semiconductor Chip <Preparation of Mask-Integrated Surface Protective Tape>

A mask material composition G was obtained in the same manner as in Comparative Example 1, except that the amount of COLONATE L in the mask material composition F prepared in Comparative Example 1 was changed to 10 mass parts.

Using a low-density polyethylene (trade name: PETROTHENE 225, manufactured by Tosoh Corporation), 100 μm-thick base film 3a was prepared by a T die method through a processing with embossing rolls which give the surface roughness Ra of 2.3 μm to the surface on which the above-described mask material composition G will be laminated, and a corona treatment performed so that the wetting tension is 48.0 mN/m.

The above-described mask material composition G was coated on a peeling liner, to form a mask material layer 3b, and the formed mask material layer was laminated on the base film 3a, to obtain a 130 μm-thick ultraviolet-curing type mask-integrated surface protective tape 3.

<Production of Semiconductor Chip>

The above-obtained ultraviolet-curing type mask-integrated surface protective tape was laminated on the surface of a silicon wafer (diameter: 8 inches) having thereon scribe lines (streets) using a laminator DR8500III (trade name, manufactured by Nitto Seiki Co., Ltd.).

After that, the surface (wafer backing-face side) opposite to the surface on which the above-described mask-integrated surface protective tape was laminated, was ground using DGP8760 (trade name, manufactured by DISCO Corporation) until a thickness of the wafer got to 50 μm. The ground wafer with the mask material was mounted on a dicing tape from the wafer backing-face side using RAD-2700F (trade name, manufactured by Lintec Corporation), and was supported and fixed to a ring flame. Further, by irradiating an ultraviolet ray of 500 mJ/cm$^2$ using a high-pressure mercury lamp from the side of the ultraviolet-curing type mask-integrated surface protective tape, an adhesion force between the base film 3a and the mask material layer 3b was reduced. In this way, only the base film 3a was peeled, while leaving only the mask material layer 3b on the wafer. Then, the mask material on the scribe line was removed by a $CO_2$ laser to form an opening on the scribe line.

After that, the silicon wafer was subjected to a plasma irradiation by a $SF_6$ gas as a plasma-generating gas from the mask material layer side at an etching rate of 15 μm/min for 5 minutes. By this plasma dicing, the wafer was cut and divided into individual chips. Then, the chips were subjected to ashing by an $O_2$ gas as a plasma-generating gas at an etching rate of 1.5 µm/min for 10 minutes, thereby to remove the mask material. After that, an ultraviolet ray was irradiated (irradiation dose: 200 mJ/cm²) from the dicing tape side, thereby to lower a temporary-adhesion force of the dicing tape, and a chip was picked up.

In the above-described Comparative Example 2, the wetting tension of the base film 3a at the surface from which the mask material layer 3b had been peeled off was measured. As a result, it was confirmed that the wetting tension was 48.0 N/m. Further, it was confirmed that the surface roughness Ra at the same surface as the forgoing was 2.3 µm.

Comparative Example 3

Preparation of Mask-Integrated Surface Protective Tape and Production of Semiconductor Chip <Preparation of Mask-Integrated Surface Protective Tape>

Using ethylene-vinyl acetate copolymer (trade name: ULTRATHENE 530, manufactured by Tosoh Corporation), 100 µm-thick base film 3a was prepared by a T die method through a processing with embossing rolls which give the surface roughness Ra of 0.02 µm to the surface on which the above-described mask material composition A as used in Example 1 will be laminated, and a corona treatment performed so that the wetting tension is 48.0 mN/m.

The above-described mask material composition A was coated on a peeling liner to form a mask material layer 3b and the formed mask material layer was laminated on the base film 3a to obtain a 130 µm-thick ultraviolet-curing type mask-integrated surface protective tape 3.

<Production of Semiconductor Chip>

The above-obtained ultraviolet-curing type mask-integrated surface protective tape was laminated on the surface of a silicon wafer (diameter: 8 inches) having thereon scribe lines (streets) using a laminator DR8500III (trade name, manufactured by Nitto Seiki Co., Ltd.).

After that, the surface (wafer backing-face side) opposite to the surface on which the above-described mask-integrated surface protective tape was laminated, was ground using DGP8760 (trade name, manufactured by DISCO Corporation) until a thickness of the wafer got to 50 µm. The ground wafer with the mask material was mounted on a dicing tape from the wafer backing-face side using RAD-2700F (trade name, manufactured by Lintec Corporation), and was supported and fixed to a ring flame. Further, by irradiating an ultraviolet ray of 500 mJ/cm² using a high-pressure mercury lamp from the side of the ultraviolet-curing type mask-integrated surface protective tape, an adhesion force between the base film 3a and the mask material layer 3b was reduced. In this way, only the base film 3a was peeled, while leaving only the mask material layer 3b on the wafer. Then, the mask material on the scribe line was removed by a $CO_2$ laser to form an opening on the scribe line.

After that, the silicon wafer was subjected to a plasma irradiation by a $SF_6$ gas as a plasma-generating gas from the mask material layer side at an etching rate of 15 µm/min for 5 minutes. By this plasma dicing, the wafer was cut and divided into individual chips. Then, the chips were subjected to ashing by an $O_2$ gas as a plasma-generating gas at an etching rate of 1.5 µm/min for 10 minutes, thereby to remove the mask material. After that, an ultraviolet ray was irradiated (irradiation dose: 200 mJ/cm²) from the dicing tape side, thereby to lower a temporary-adhesion force of the dicing tape, and a chip was picked up.

In the above-described Comparative Example 3, the wetting tension of the base film 3a at the surface from which the mask material layer 3b had been peeled was measured. As a result, it was confirmed that the wetting tension was 48.0 N/m. Further, it was confirmed that the surface roughness Ra at the same surface as the forgoing was 0.02 µm.

Comparative Example 4

Preparation of Mask-Integrated Surface Protective Tape and Production of Semiconductor Chip <Preparation of Mask-Integrated Surface Protective Tape>

2 mole % of methacrylic acid, 20 mole % of 2-ethylhexyl acrylate, 70 mole % of butyl acrylate, and 8 mole % of methyl acrylate were mixed. The mixture was subjected to a solution polymerization, to synthesize a (meth)acrylic copolymer (mass-average molecular weight: 400,000, hydroxyl group value: 0 mg KOH/g, acid value: 16.1 mg KOH/g, and Tg: −35° C.).

To the solution of this (meth)acrylic copolymer, with respect to 100 mass parts of said copolymer, 2 mass parts of TETRAD X (trade name: epoxy curing agent, manufactured by Mitsubishi Gas Chemical Company, Inc.) as a curing agent, was blended, to obtain a mask material composition H.

Using ethylene-vinyl acetate copolymer (trade name: ULTRATHENE 631, manufactured by Tosoh Corporation), 100 µm-thick base film 3a was prepared by a T die method through a processing with embossing rolls which give the surface roughness Ra of 0.04 µm to the surface on which the above-described mask material composition H will be laminated, and a corona treatment performed so that the wetting tension is 54.0 mN/m.

The above-described mask material composition H was coated on a peeling liner to form a mask material layer 3b and the formed mask material layer was laminated on the base film 3a, to obtain a 130 µm-thick ultraviolet-curing type mask-integrated surface protective tape 3.

<Production of Semiconductor Chip>

The above-obtained ultraviolet-curing type mask-integrated surface protective tape was laminated on the surface of a silicon wafer (diameter: 8 inches) having thereon scribe lines (streets) using a laminator DR8500III (trade name, manufactured by Nitto Seiki Co., Ltd.).

After that, the surface (wafer backing-face side) opposite to the surface on which the above-described mask-integrated surface protective tape was laminated, was ground using DGP8760 (trade name, manufactured by DISCO Corporation) until a thickness of the wafer got to 50 µm. The ground wafer with the mask material was mounted on a dicing tape from the wafer backing-face side using RAD-2700F (trade name, manufactured by Lintec Corporation), and was supported and fixed to a ring flame. Further, by irradiating an ultraviolet ray of 500 mJ/cm² using a high-pressure mercury lamp from the side of the ultraviolet-curing type mask-integrated surface protective tape, an adhesion force between the base film 3a and the mask material layer 3b was reduced. In this way, only the base film 3a was peeled, while leaving only the mask material layer 3b on the wafer. Then, the mask material on the scribe line was removed by a $CO_2$ laser to form an opening on the scribe line.

After that, the silicon wafer was subjected to a plasma irradiation by a $SF_6$ gas as a plasma-generating gas from the mask material layer side at an etching rate of 15 µm/min for 5 minutes. By this plasma dicing, the wafer was cut and divided into individual chips. Then, the chips were subjected to ashing by an $O_2$ gas as a plasma-generating gas at an etching rate of 1.5 µm/min for 10 minutes, thereby to remove the mask material. After that, an ultraviolet ray was irradiated (irradiation dose: 200 mJ/cm²) from the dicing tape side, thereby to lower a temporary-adhesion force of the dicing tape, and a chip was picked up.

In the above-described Comparative Example 4, the wetting tension of the base film 3a at the surface from which the mask material layer 3b had been peeled was measured. As a result, it was confirmed that the wetting tension was 54.0 N/m. Further, it was confirmed that the surface roughness Ra at the same surface as the forgoing was 0.04 μm.

Test Example 1

Wetting Tension Evaluation of Base Film

From the mask-integrated surface protective tape in each of the above-described Examples and Comparative Examples, the results of 3 test pieces of test specimens of width 200 mm×length 300 mm were collected.

A tension checker liquid (trade name: manufactured by Kasuga Electric Works, Ltd.) was infiltrated with an absorbent cotton. The tension checker liquid was coated on the sample base film. The coated liquid surface after 2 seconds was observed, and the wet condition of the tension checker liquid used was determined.

Test Example 2

Storage Elastic Modulus Evaluation

G' (torsional shear method) of the mask material which had been peeled from the base film before ultraviolet irradiation was measured under the conditions of test specimen: cylindrical-shape measuring instrument of 8 mmφ×3 mm: DAYNAMIC ANALYSER RAD II (trade name: manufactured by REOMETRIC Scientific F.E. Corp.), measuring frequency: 1 Hz.

In the <Production of Semiconductor Chip> in each of the above-described Examples and Comparative Examples, a force (peeling property) required for peeling the base material layer from the mask material layer of the mask-integrated surface protective tape was evaluated in accordance with the following criterion. The above-described peeling was carried out using RAD-2700F (trade name, manufactured by Lintec Corporation).

—Criterion for Evaluation of Peeling Force (Adhesion Force) Between Base film and Mask Material Layer—

From the semiconductor wafer-surface protective temporary-adhesive tape in each of the above-described Examples and Comparative Examples, the results of 3 test pieces of test specimens of width 25 mm×length 300 mm were collected. On 2.0 mm-thick SUS steel sheet defined in JIS G 4305, which was finished with a #280 waterproof abrasion paper sheet defined in JIS R 6253, each test specimen was press-bonded (or crimped) by a rubber roll having a weight of 2 kg over 3 round trips. After leaving it for 1 hr., the adhesion force was measured at 23° C. using a tensile tester conforming to JIS B 7721, in which the measured value falls within the range of 15% to 85% of its capacity. The measurement was carried out according to a 180° peeling method with a pulling speed of 300 mm/min.

Test Example 3

Evaluation of Removal Property of Mask Material Layer by $O_2$ Plasma Ashing

In the <Production of Semiconductor Chip> in each of the above-described Examples and Comparative Examples, the presence or absence of the residual masking material after $O_2$ plasma ashing (ashing at the etching rate of 1.5 μm/min for 10 min.) was examined using a laser microscope.

—Evaluation Criteria of Removal Property of Mask Material Layer—

○ (Good): There is no residual of the mask material layer.
× (Poor): There is a residual of the mask material layer.

Test Example 4

Evaluation of Infiltration Property of Grinding Water

In the <Production of Semiconductor Chip> in each of the above-described Examples and Comparative Examples, before peeling a base film, a wafer surface was observed through the base film using a microscope to examine the presence or absence of infiltration of the grinding water.

—Criterion for Evaluation of Infiltration of Grinding Water (Criterion for Evaluation of Adhesion Property at the Time of Backgrinding)—

○ (Good): After backgrinding, the base film was peeled, so that it could be confirmed with the naked eye that there was no infiltration of grinding water between the mask material layer and the semiconductor wafer.

Δ (Moderate): After backgrinding, the base film was peeled, so that it could be confirmed with the naked eye that there was infiltration of grinding water between the mask material layer and the semiconductor wafer.

× (Poor): After backgrinding, the base film was peeled, so that it could be confirmed with the naked eye that there was infiltration of grinding water between the mask material layer and the semiconductor wafer, and this caused crack in the semiconductor wafer.

The results obtained in Test Examples 1 to 4 are shown collectively in the following Tables 1 and 2.

TABLE 1

|  |  | Ex 1 | Ex 2 | Ex 3 | Ex 4 | Ex 5 |
| --- | --- | --- | --- | --- | --- | --- |
| Mask material layer | Type | Radiation-curing type | Radiation-curing type | Radiation-curing type | Radiation-curing type | Pressure-sensitive type |
|  | Contact angle (°) | 81 | 79 | 118 | 74 | 78 |
|  | Storage modulus 23° C. (Pa) | $2.2 \times 10^4$ | $5.5 \times 10^4$ | $1.5 \times 10^5$ | $8.5 \times 10^4$ | $1.3 \times 10^5$ |
|  | 50° C. | $1.2 \times 10^4$ | $2.5 \times 10^4$ | $6.5 \times 10^4$ | $4.1 \times 10^4$ | $1.1 \times 10^5$ |
| Base film | Wetting tension (mN/m) | 22.6 | 48.0 | 38.0 | 38.0 | 38.0 |
|  | Surface roughness Ra (μm) | 1.1 | 0.9 | 0.06 | 1.9 | 0.9 |
|  | Young's modulus (Pa) | $3.0 \times 10^7$ | $4.0 \times 10^7$ | $4.0 \times 10^7$ | $4.0 \times 10^7$ | $1.5 \times 10^7$ |
| Peeling force (adhesion force) between base film and mask material layer (N/25 mm) |  | 0.5 | 0.2 | 0.3 | 0.3 | 0.3 |
| Removal property of mask material layer |  | ○ | ○ | ○ | ○ | ○ |
| Infiltration property of grinding water |  | ○ | ○ | ○ | ○ | ○ |

Note:
Ex indicates Example according to this invention

TABLE 2

|  |  | C Ex 1 | C Ex 2 | C Ex 3 | C Ex 4 |
|---|---|---|---|---|---|
| Mask material layer | Type | Radiation-curing type | Radiation-curing type | Radiation-curing type | Pressure-sensitive type |
|  | Contact angle (°) | 120 | 47 | 81 | 78 |
|  | Storage modulus 23° C. (Pa) | $1.6 \times 10^5$ | $2.0 \times 10^5$ | $2.2 \times 10^4$ | $2.3 \times 10^5$ |
|  | 50° C. | $1.4 \times 10^5$ | $1.8 \times 10^5$ | $1.2 \times 10^4$ | $2.1 \times 10^5$ |
| Base film | Wetting tension (mN/m) | 54 | 48 | 48 | 54 |
|  | Surface roughness Ra (μm) | 0.9 | 2.3 | 0.02 | 0.04 |
|  | Young's modulus (Pa) | $1.0 \times 10^6$ | $4.4 \times 10^8$ | $4.0 \times 10^7$ | $1.5 \times 10^7$ |
| Peeling force (adhesion force) between base film and mask material layer (N/25 mm) |  | 0.9 | 1.2 | 0.3 | 0.7 |
| Removal property of mask material layer |  | x | x | x | x |
| Infiltration property of grinding water |  | ○ | Δ | ○ | x |

Note:
C Ex indicates Comparative Example

It was found from the results in each of the above-described Test Examples that when producing a semiconductor chip by processing a semiconductor wafer in accordance with a plasma dicing method, a mask can be formed easily without adhesive deposit only by a process of: using a mask-integrated surface protective tape of the present invention, and laminating said mask-integrated surface protective tape on the patterned surface of the semiconductor wafer, and then peeling a base film from the laminated mask-integrated surface protective tape. Further, in backgrinding, there was no peeling between a base film and a mask material layer, whereby there were neither contamination of the patterned surface nor damage of the semiconductor wafer. In other words, because of a high protection property of the patterned surface of the semiconductor wafer at the time of backgrinding, a good backgrinding for thinning could be achieved. Further, in peeling the base film from the mask material layer after backgrinding, there was no residual of the adhesive deposit, whereby the mask material layer could be exposed successfully. Further, this mask material at a portion corresponding to the street was removed certainly by a laser, whereby the mask with respect to the patterned surface could be formed accurately. Further, it was found that the mask material on the patterned surface could be removed more certainly by $O_2$ plasma, whereby occurrence of a defective chip was possible to be highly suppressed. In other words, a mask formation with respect to the patterned surface and a removal processing was possible to be performed accurately and certainly, so that contamination of the patterned surface or the like was possible to be suppressed and as a result, occurrence of the defective chip could be highly suppressed.

Having described our invention as related to the present embodiments, it is our intention that the invention not be limited by any of the details of the description, unless otherwise specified, but rather be construed broadly within its spirit and scope as set out in the accompanying claims.

This application claims priority on Patent Application No. 2016-167148 filed in Japan on Aug. 29, 2016, which is entirely herein incorporated by reference.

REFERENCE SIGNS LIST 1 semiconductor wafer
2 patterned surface
3 mask-integrated surface protective tape
  3a base film
  3b mask material layer
4 wafer-fixing tape
7 singulated chip
S surface
B backing-face
M1 wafer-grinding apparatus
M2 pin
M3 collet
F ring flame
L laser ($CO_2$ laser)
P1 plasma of $SF_6$ gas
P2 plasma of $O_2$ gas

The invention claimed is:

1. A process for producing semiconductor chips using a mask-integrated surface protective tape, wherein the mask-integrated surface protective tape comprises a base film and a mask material layer on the base film, said process comprising:
  (a) a step of, in a state of having laminated the mask-integrated surface protective tape on a side of a patterned surface of a semiconductor wafer, grinding a backing-face side of the semiconductor wafer; laminating a wafer fixing tape on the backing-face side of the semiconductor wafer; and supporting and fixing the semiconductor wafer to a ring flame;
  (b) a step of, after peeling the base film of the mask-integrated surface protective tape, thereby exposing the mask material layer on top, forming an opening of a street of the semiconductor water by cutting a portion of the mask material layer corresponding to the street of the semiconductor wafer by laser;
  (c) a plasma-dicing step of segmentalizing the semiconductor wafer on the street by a $SF_6$ plasma, thereby singulating the semiconductor wafer into semiconductor chips; and
  (d) an ashing step of removing the mask material layer by an $O_2$ plasma,
wherein a wetting tension of the base film on a side from which the mask material layer is peeled is 20.0 mN/m or more and 48.0 mN/m or less, and wherein a surface roughness Ra of the base film on the side from which the mask material layer is peeled is within a range of 0.05 μm or more and 2.0 μm or less when measured in conformity to JIS B0601.

2. The process for producing semiconductor chips according to claim 1, wherein an unevenness on the patterned surface of the semiconductor wafer on which the mask-integrated surface protective tape is laminated is 10 μm or more.

\* \* \* \* \*